United States Patent
Okubo et al.

(12) 
(10) Patent No.: US 6,300,783 B1
(45) Date of Patent: Oct. 9, 2001

(54) PROBE, MANUFACTURE OF SAME, AND VERTICALLY OPERATIVE TYPE PROBE CARD ASSEMBLY EMPLOYING SAME

(75) Inventors: Masao Okubo, Nishinomiya; Kazumasa Okubo, Kanagawa; Hiroshi Iwata, Kyoto, all of (JP)

(73) Assignee: Nihon Denshizairyo Kabushiki Kaisha, Hyogo (JP)

( * ) Notice: Subject to any disclaimer, the term of this patent is extended or adjusted under 35 U.S.C. 154(b) by 0 days.

(21) Appl. No.: 09/148,147

(22) Filed: Sep. 4, 1998

Related U.S. Application Data

(62) Division of application No. 08/773,252, filed on Dec. 23, 1996.

(30) Foreign Application Priority Data

Feb. 13, 1996 (JP) .................................... 8-51053
Feb. 29, 1996 (JP) .................................... 8-71512
May 10, 1996 (JP) .................................... 8-141081

(51) Int. Cl.[7] .................................................. G01R 31/02
(52) U.S. Cl. .......................................... 324/761; 324/754
(58) Field of Search ................................ 324/754, 72.5, 324/761, 755, 765; 439/482; 29/825

(56) References Cited

U.S. PATENT DOCUMENTS

| | | | |
|---|---|---|---|
| 4,618,821 | * 10/1986 | Lenz | 324/754 |
| 5,055,777 | * 10/1991 | Bonelli et al. | 324/72.5 |
| 5,124,639 | * 6/1992 | Carlin et al. | 439/482 |
| 5,325,052 | * 6/1994 | Yamashita | 324/760 |
| 5,367,254 | * 11/1994 | Faure et al. | 324/761 |
| 5,720,098 | * 2/1998 | Kister | 29/825 |

* cited by examiner

Primary Examiner—Vinh P. Nguyen
(74) Attorney, Agent, or Firm—Sughrue, Mion, Zinn, Macpeak & Seas, PLLC

(57) ABSTRACT

A first assembly configuration features in including: a plurality of probes having a buckling portion to buckle, upon a contact by an end of a contact portion onto an electrode of semiconductor integrated circuit; a first board provided with a first wiring pattern connected with a connecting portion of the probe; a second board removably fastened with the first board and provided with a second wiring pattern connected with the first wiring pattern; housing members mounted with the second board for holding the contact portion of the probe. Next configuration features in including: two kinds of probes; measurement probes and connection probes anew, and a plurality of connection probes include buckling portions to buckle, upon a contact by an end of contact portion onto the wiring pattern provided with the first board when inserted into holes provided with the a second board; wherein through holes provided with the second board are positioned to align to the arrangement of wiring pattern provided with the first board. Thereby, undesirable deviation of contact point by the probe is avoided and a suitable contact pressure is preferably kept, and further convenience in the work of exchanging damaged probes is brought about.

14 Claims, 25 Drawing Sheets

PROBE, MANUFACTURE OF SAME, AND VERTICALLY OPERATIVE TYPE PROBE CARD ASSEMBLY EMPLOYING SAME

This is a divisional of application Ser. No. 08/773,252 filed Dec. 23, 1996, the disclosure of which is incorporated herein by reference.

FIELD OF THE INVENTION

This invention relates to a probe for measuring electrical characteristics of a semiconductor integrated circuit, manufacture of the same, and a probe card assembly of vertically operative type employing the same which avoids undesireable contact and offers convenience in the work of exchanging a probe. The concept of the probe card assembly is explained in U.S. Pat. No. 5,134,365 granted Jul. 28, 1992.

DESCRIPTION OF THE RELATED ART

A conventional art of the vertically operative type probe card assembly will be described with reference to FIGS. 24 and 25, attached.

A conventional art of the vertically operative type probe card assembly includes, as shown in FIG. 24, a plurality of probes 850, and board 860 fastening probes 850, and housing members 870 mounted on the underside of board 860.

The probe 850 is generally shaped in a needle work, of which a front part includes contact portion 851 for contacting onto electrode 710 of semiconductor integrated circuit 700 and a back part includes connecting portion 852 to be connected by connector 854, such as gold line, to a wiring pattern formed on board 860.

Therein flexible portion 853 in a generally lateral U shape is formed between contact portion 851 and connecting portion 852. The flexible portion 853 is intended, as shown in FIG. 25, to bend or flex for keeping a desired contact pressure when a contact is made between contact portion 851 and electrode 710.

Housing members 870 include two guide boards 871, 872 provided with through holes 871A, 872A, and a pair of walls 823 for fastening two guide boards 871, 872 with board 860. Through holes 871A, 872A in two guide boards 871, 872 are provided for insertion of contact portions 851 of probes 850 and arranged to align to positional pattern of electrodes 710 of semiconductor integrated circuit 700 for measurement.

On the other hand, board 860 is provided on its upperside with predetermined wiring pattern (not shown) and with a through hole 861 into which connecting portion 852 of probe 850 is inserted. See FIG. 25. Connecting portion 852 inserted in through hole 861 will be connected to the wiring pattern above.

However, such conventional probe card assembly of vertically operative type as noted has been found to have problems or difficulties as below:

Normally such a probe card assembly of vertically operative type has been mounted with several hundreds or several thousands of probes in commercial operation, and replacement of some probes is necessary during operation when such probes are found to be worn out or damaged.

This replacement or exchange work of probes needs preliminary work of removing solder mass applied to the wiring pattern bonded with the connecting portions, and then taking the probes away from the board. However, lateral U letter shaped flexible portion 853 of each probe 850 hinders itself, due to steric figuration, from being pulled out through the through hole 861 of board 860. For this reason, disassembling of housing members 870 is necessary prior to exchange probes 850. The way of removing the probes 850 without disassembling thereof is possible when the probes can be cut at the flexible portions 853. However such approach will incidentally injure other probes which are needless to be exchanged in the case of commercial operation where so many probes are equipped with the probe card assembly of vertically operative type, and therefore impossible in fact.

If such approach of exchange work should be possible, it requires, after removal of probes 850 of interest from board 860, inserting new probes 850 through the through hole 861 of board 860 as well as through holes 871A, 872A of two guide boards 871, 872, and uniformizing heightwise positions of the contact portions 851 of new probes with those of other unchanged probes, and arranging orientations of the flexible portions 853 so as to be free from contact each other, and then soldering for bonding the connecting portions 852 with the wiring pattern. Thus, in the case of a commercial probe card assembly equipped with so many probes, the work of exchanging probes is labor intensive which requires performance by a skilled person with an excess amount of cautions.

Further, a conventional probe card assembly has had such measurements as: about 6 mm vertical thickness of the board, about 10 mm vertical length of the housing members, thus a probe has been about 20 mm length. Recent semiconductor integrated circuits have much progressed in employing higher speed signals and in turn require best shorter probes and wiring patterns in order to minimize signal attenuation and cross-talk troubles in advance. However, the probe length employed in the probe card assembly of vertically operative type has at shortest about 20 mm in the state of art, though further shortening has been desired as to probe length.

In addition, probes have been normally manufactured from tungsten wires which were produced by drawing tungsten rods manufactured by powder metallurgy. For this cause, drawing of tungsten wire extends flaw or defect to extend along the length of probes, so that cut sections of the drawn tungsten wires, that is, contact portions have more trend of forming irregularities, and thus the probe contact portions are easier to attract foreign matters than other portions.

In order to overcome such problems heretofore, the probes which have been applied to contact with electrodes are subject to cleaning for removing foreign matters from the contact portions. Otherwise the prior step is taken to make the contact portions round. However, the cleaning requires regular maintenance and as a result causes suspension of the operation employing the probes, and making round contact portions includes difficulty in forming a correct semi circle at the end of the contact portion and also difficulty in processing many probes concurrently, thus poor production efficiency.

On the other hand, some electrodes are in shapes of semi circular bump. Such electrodes should be applied by probes having a flat end of the contact portion, but such type of probes tends to change the shape of the end by the cleaning and in turn to make it difficult to obtain correct measurements subsequently.

SUMMARY OF THE INVENTION

The present invention intends to offer a probe card assembly of vertically operative type employing shorter length probes with the merit of facilitating the work of exchanging used probes even in the case where so many probes are equipped, and the probes suitable for such application, and process of manufacturing such probes.

A probe of the present invention features in a shape of generally needle work, and in having a buckling portion to bend or to buckle, upon contact onto an electrode of semiconductor integrated circuit at the end of its contact portion, wherein the probe has a generally round section and its buckling portion is thinner than other portions excepting the end of the contact portion, and the contact portion and the buckling portion are formed to be linear.

A process for manufacturing a probe of the present invention features generally in the process of manufacturing a probe for making a contact onto an electrode of semiconductor integrated circuit and in including a step of heating up to be molten the contact portion to be used to make a contact onto the electrode, and a step of forming a minuscule ball from the molten part.

A first probe card assembly configuration of vertically operative type features in including: a plurality of probes having a buckling portion to bend or to buckle, upon a contact by the end of its contact portion onto an electrode of semiconductor integrated circuit; and a first board provided with a first wiring pattern connected with a connecting portion of the probe; and a second board removably fastened with the first board and provided with a second wiring pattern connected with the first wiring pattern; and housing members mounted with the second board for holding the contact portion of the probe; wherein the probe has a generally round section and its buckling portion is thinner than other portions excepting the end of the contact portion, and the contact portion and the buckling portion are formed to be linear, and wherein through holes are provided with the first board for the respective probes inserting through, and second board is provided with space for probes extending through in the state as-suspended from the first board.

A second probe card assembly configuration of vertically operative type features in including: a plurality of measurement probes provided respectively with buckling portions which will buckle, upon a contact by the end of its contact portion onto electrode of semiconductor integrated circuit; first board provided with wiring pattern connecting to the end of connecting portions of measurement probes; second board superjacent to and fastened removably with first board; a plurality of connection probes provided respectively with buckling portions which will buckle, upon a contact by the end of contact portion onto wiring pattern when inserted into through hole provided with second board; wherein the measurement probes and the connection probes are generally round in section, and their buckling portions are thinner than other portions excepting the ends of contact portions, and contact portions and buckling portions are shaped generally to be linear, and wherein the first board is provided with through holes for the measurement probes inserting, and the second board is provided with wiring pattern connecting to the back ends of the connecting portions of the probes for circuit connection.

Further, a third probe card assembly configuration of vertically operative type features in including: a plurality of probes each provided with contact portion, and buckling portion which will buckle, upon a contact by the end of contact portion to an electrode of semiconductor integrated crcuit; a board provided at least on upperside with wiring pattern to which connecting portion of probe is connected; supporting members mounted underside of the board for supporting probes; wherein each probe is generally round and buckling portion thereof is slender than other portions excepting the end of contact portion, and contact and buckling portions are shaped to be linear; and wherein the board is provided with through holes for probes extending through; and the supporting members including; a plurality of probe supporters made from insulative material and provided at periphery with a plurality of flutes for holding probes whose buckling portions take position inside the flutes, and fastening means for fastening removably the probe supporters underside of the board respectively.

In summary, these 25 figures are grouped into 4 groups: probe configuration, manufacture of probes, probe card assembly configuration, related art.

Figure 1:
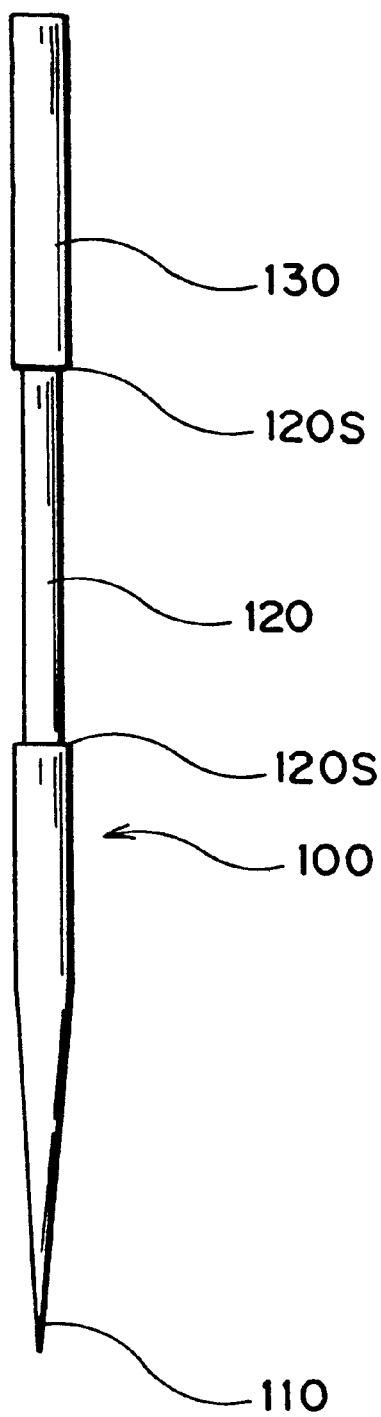
FIG. 1 shows a schematic front elevation view of a first probe of the present invention.
Figure 2:
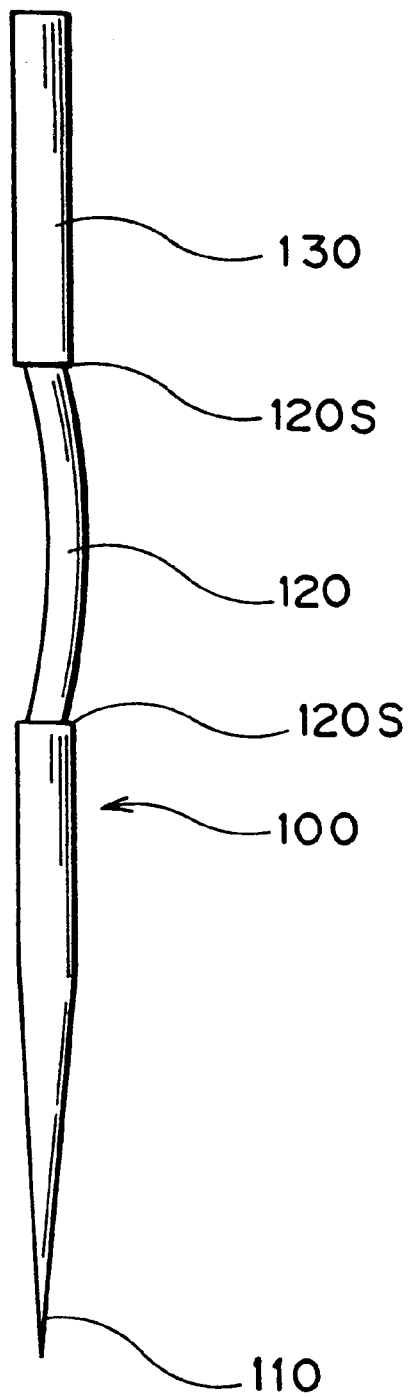
FIG. 2 shows a schematic front elevation view of a probe of the present invention for special purpose of explaining the buckling act.
Figure 3:
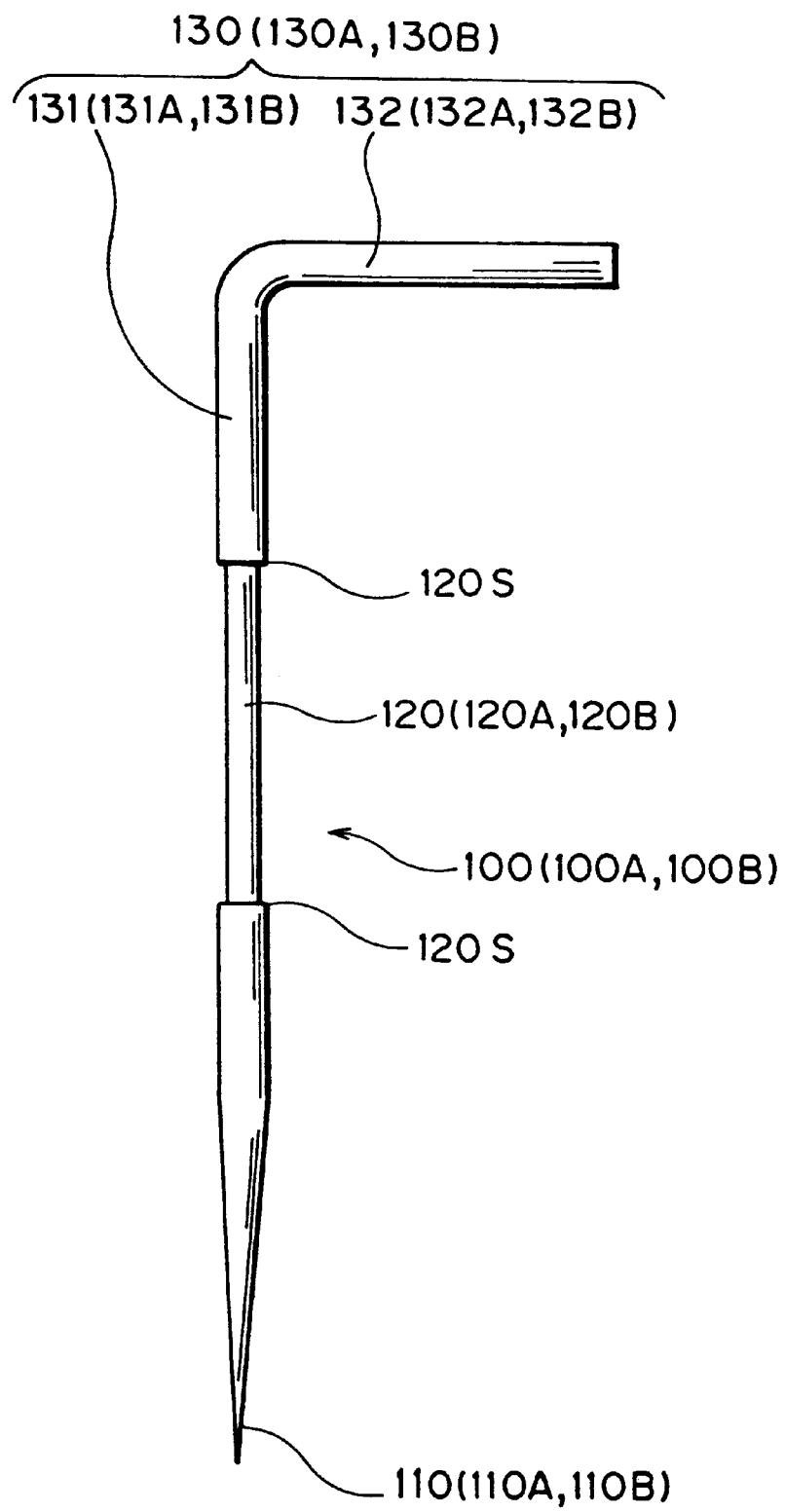
FIG. 3 shows a schematic front elevation view of a second probe of the present invention.
Figure 4:
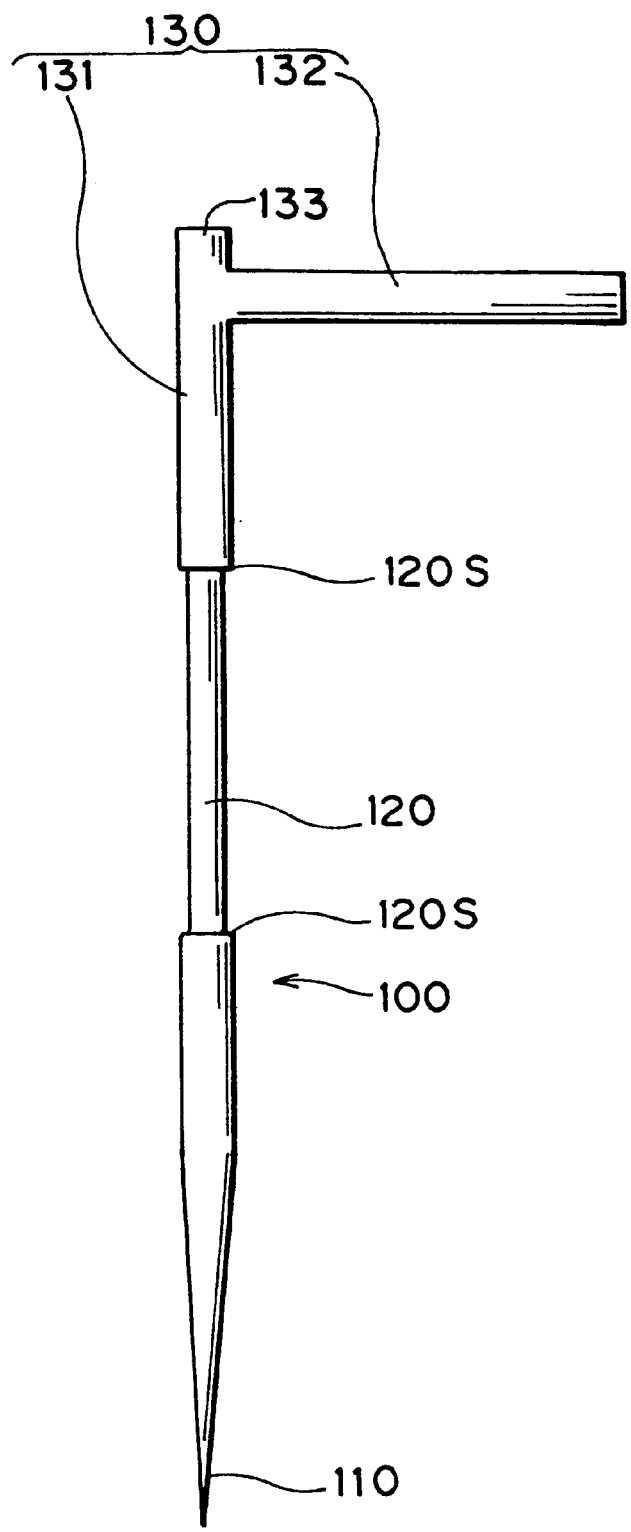
FIG. 4 shows a schematic front elevation view of a third probe of the present invention.

FIGS. 1 to 4 are for probe confirguration wherein three embodiments are shown (FIG. 1 for 1st, FIG. 3 for 2nd, FIG. 4 for 3rd.).

Figure 5:
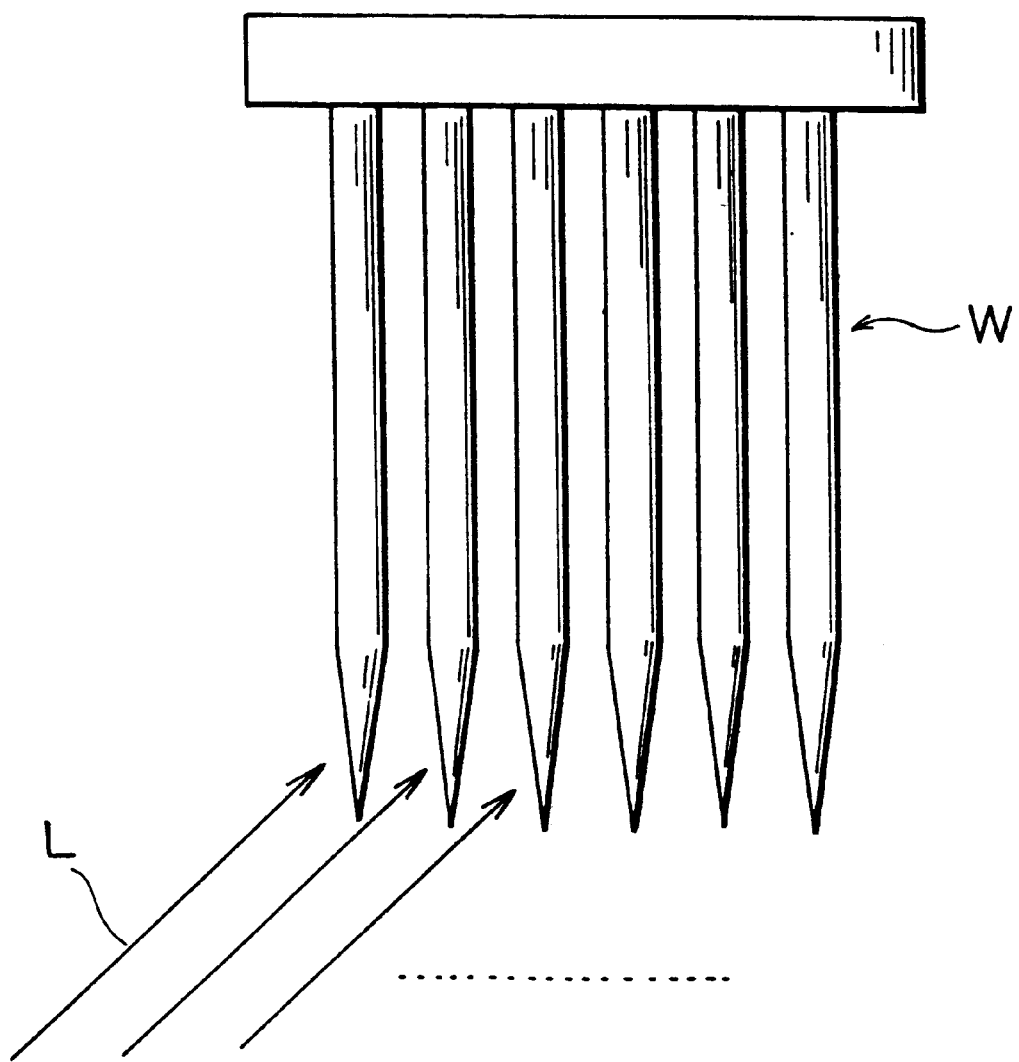
FIG. 5 shows a schematic view for explaining a first process of manufacturing probes of the present invention.
Figure 6:
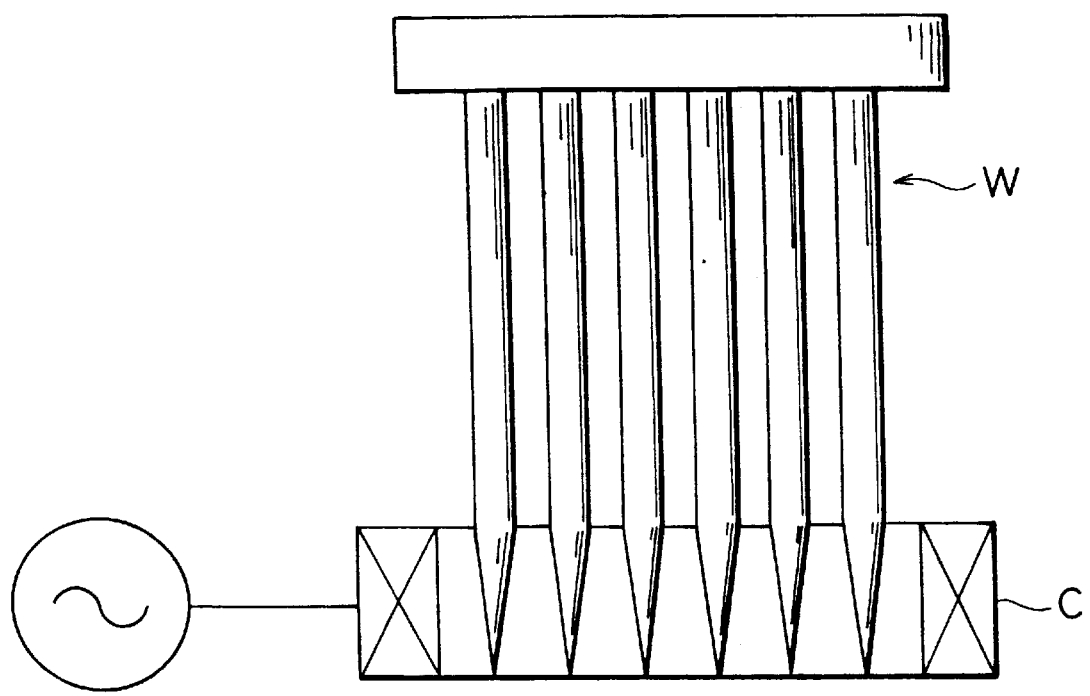
FIG. 6 shows a schematic view for explaining a second process of manufacturing probes of the present invention.
Figure 7:
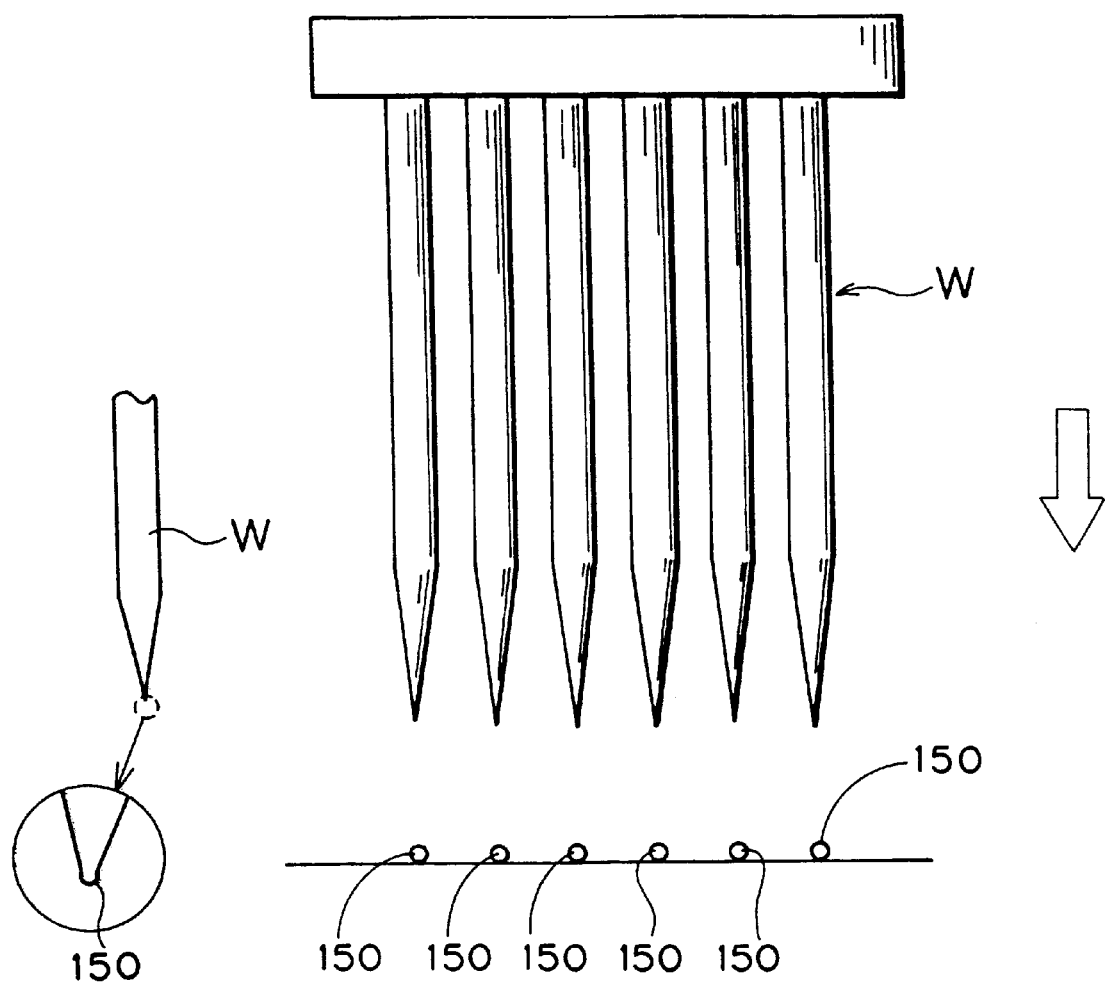
FIG. 7 shows a schematic view for explaining a third process of manufacturing probes of the present invention.

FIGS. 5 to 7 are for manufacture of probes wherein three embodiments are shown (FIG. 5 for 1st, FIG. 6 for 2nd, FIG. 7 for 3rd.).

Figure 12:
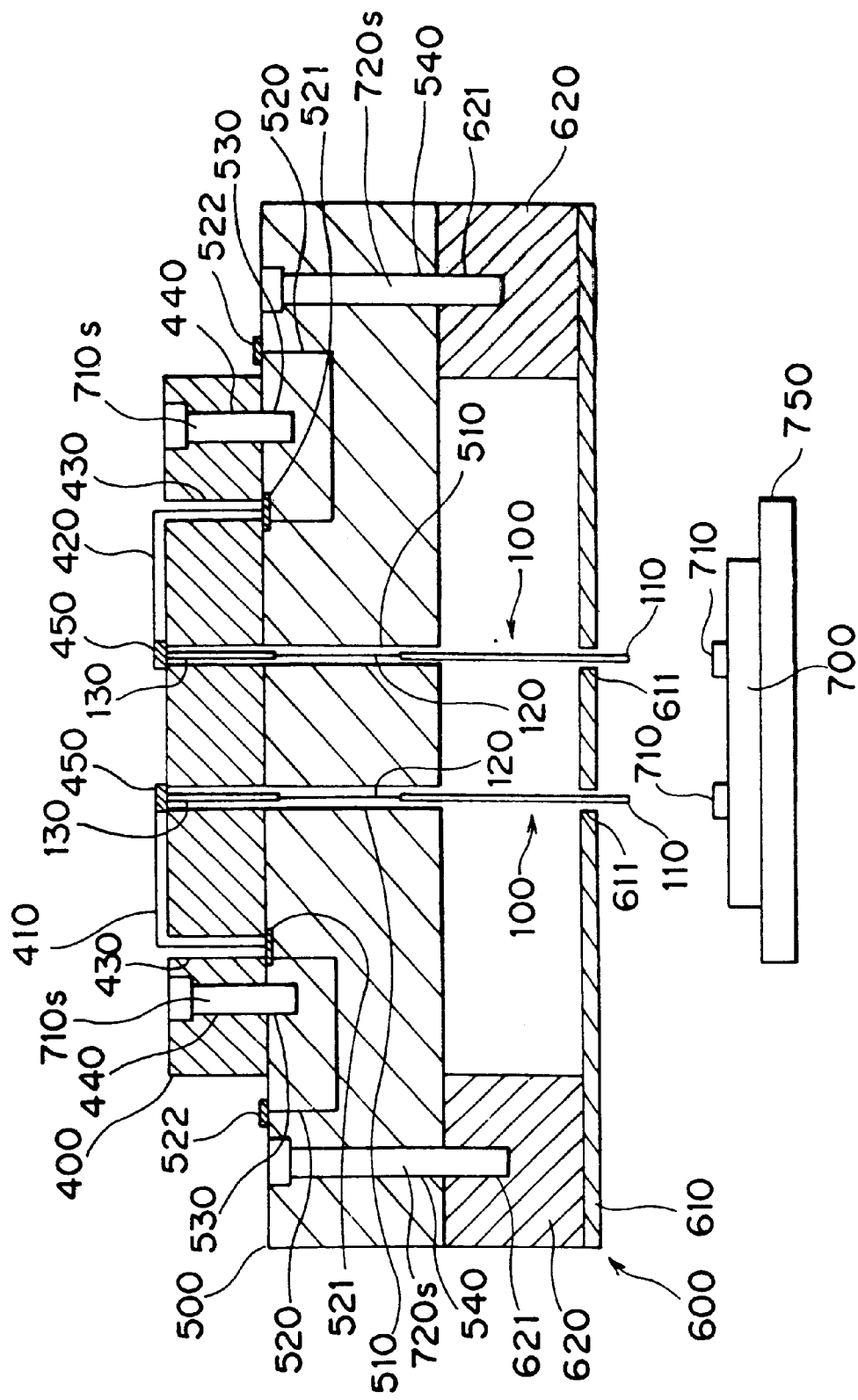
FIG. 12 shows a schematic, vertically sectioned view of a second probe card assembly of vertically operative type belonging to the present invention.
Figure 13:
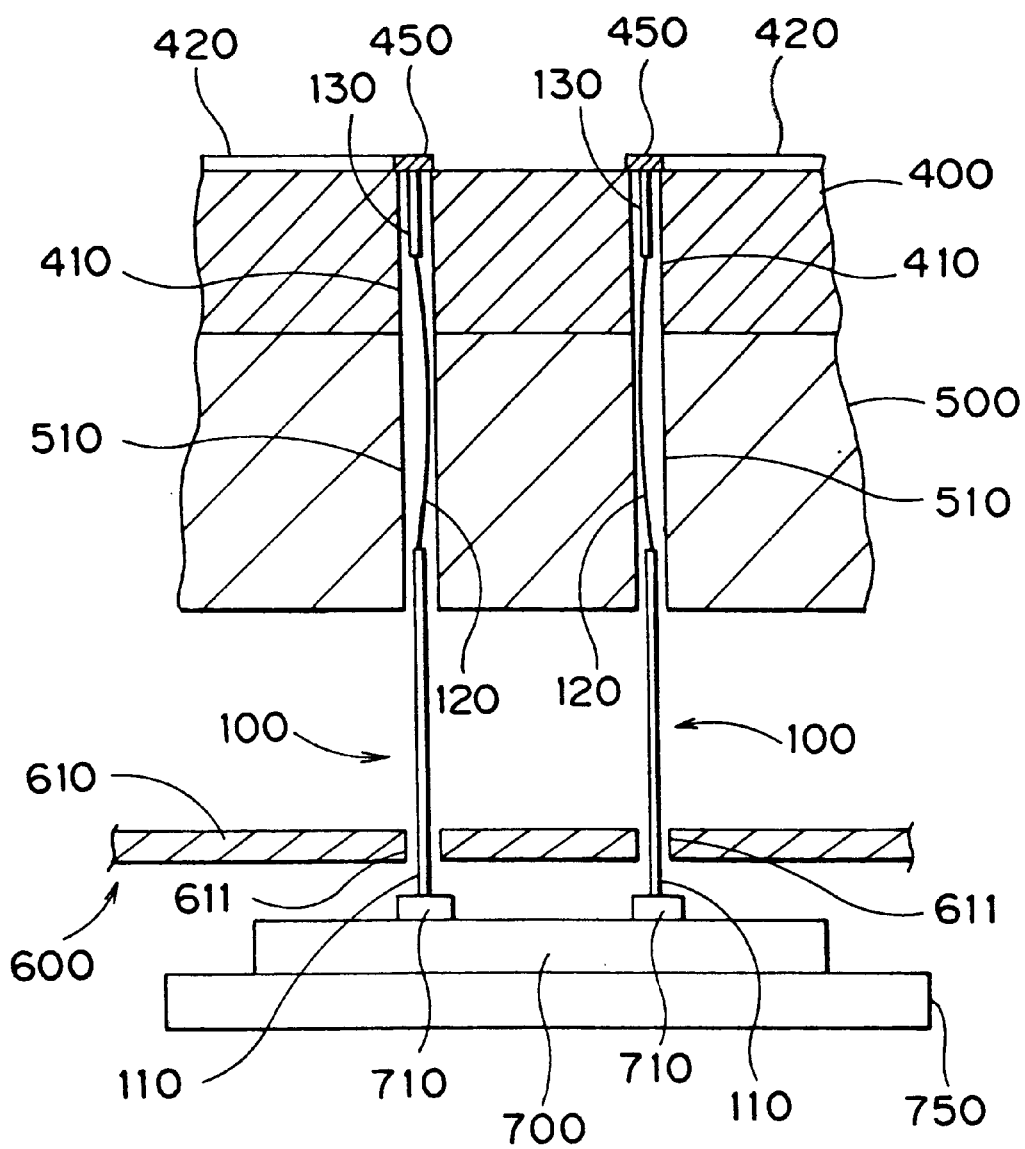
FIG. 13 shows a schematic view of key portions of the second probe card assembly in action.
Figure 14:
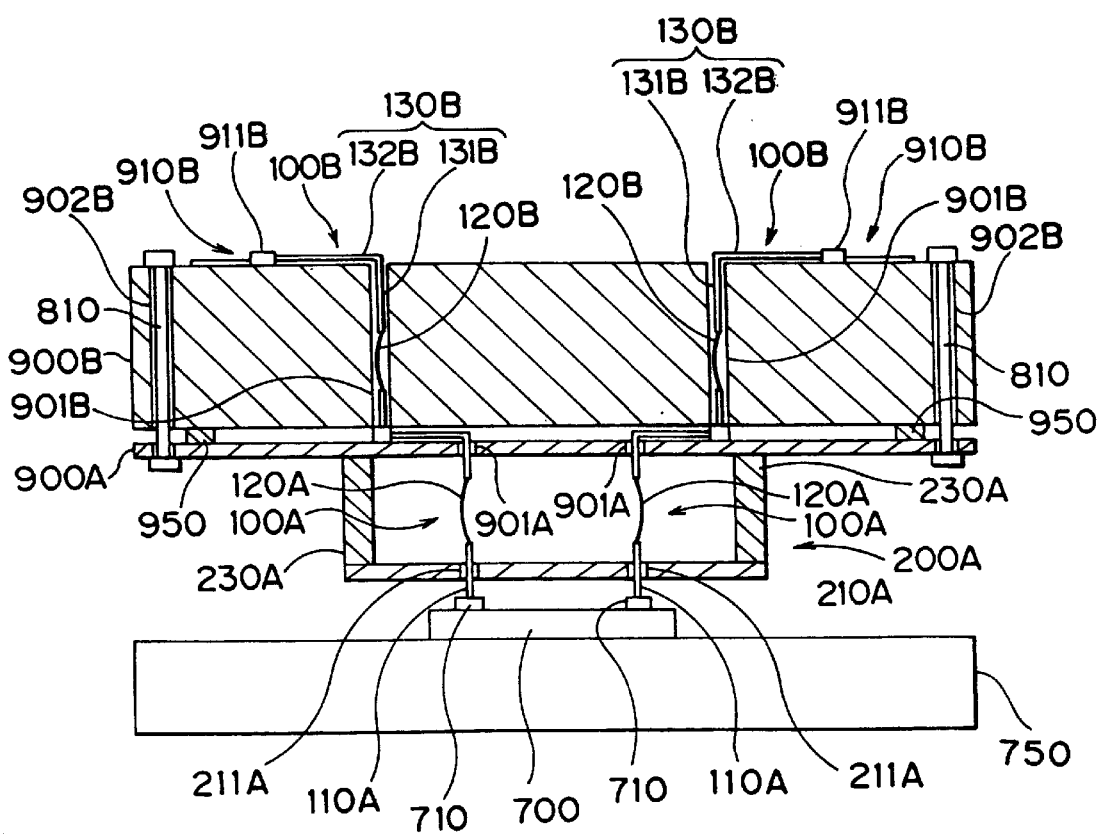
FIG. 14 shows a schematic view of a third probe card assembly of vertically operative type belonging to the present invention.
Figure 15:
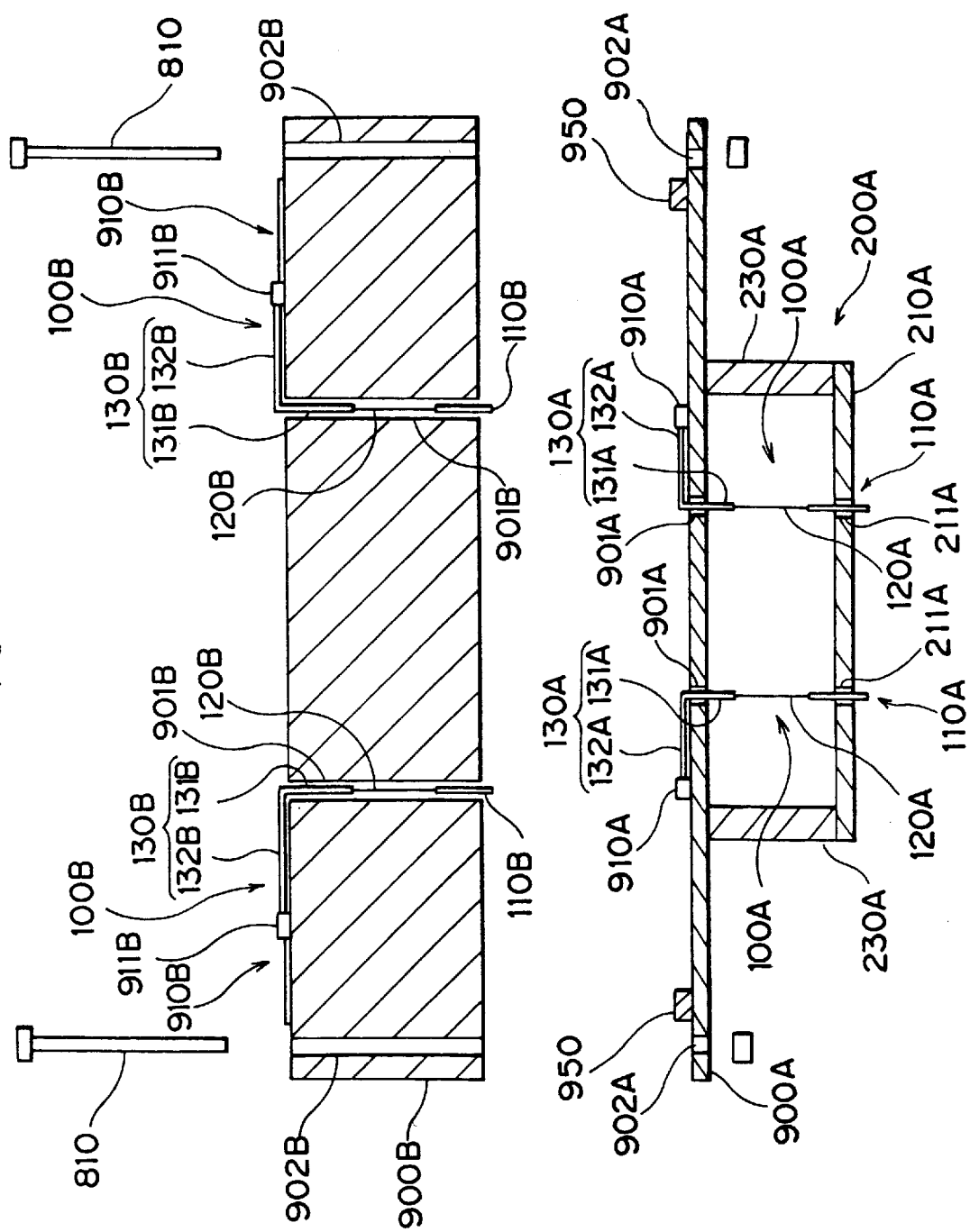
FIG. 15 shows a schematic, exploded view of the third probe card assembly.
Figure 16:
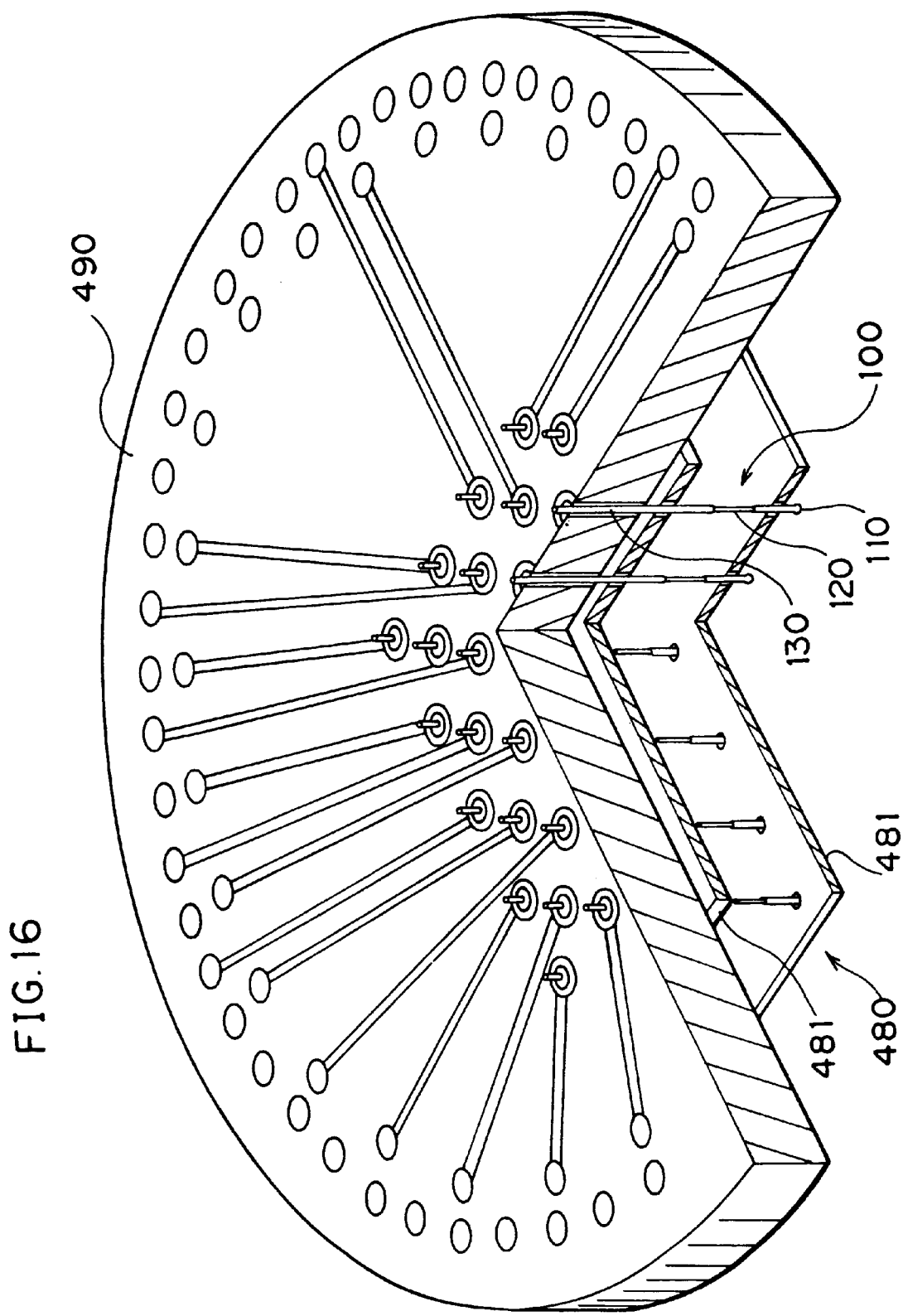
FIG. 16 shows a schematic, partially cutaway perspective view of a fourth probe card assembly of vertically operative type belonging to the present invention.
Figure 17:
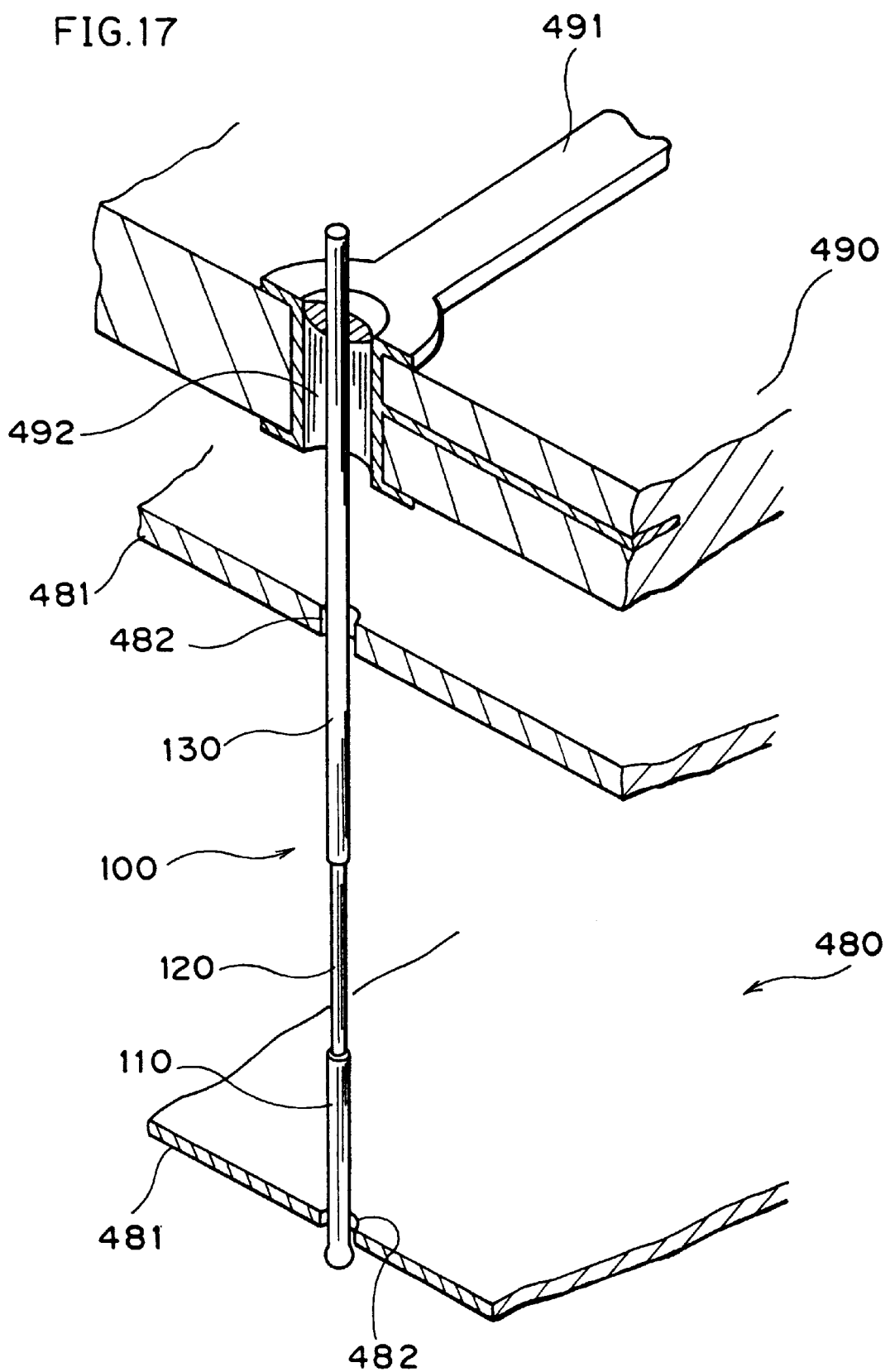
FIG. 17 shows a schematic, exploded view of the fourth probe card assembly.
Figure 18:
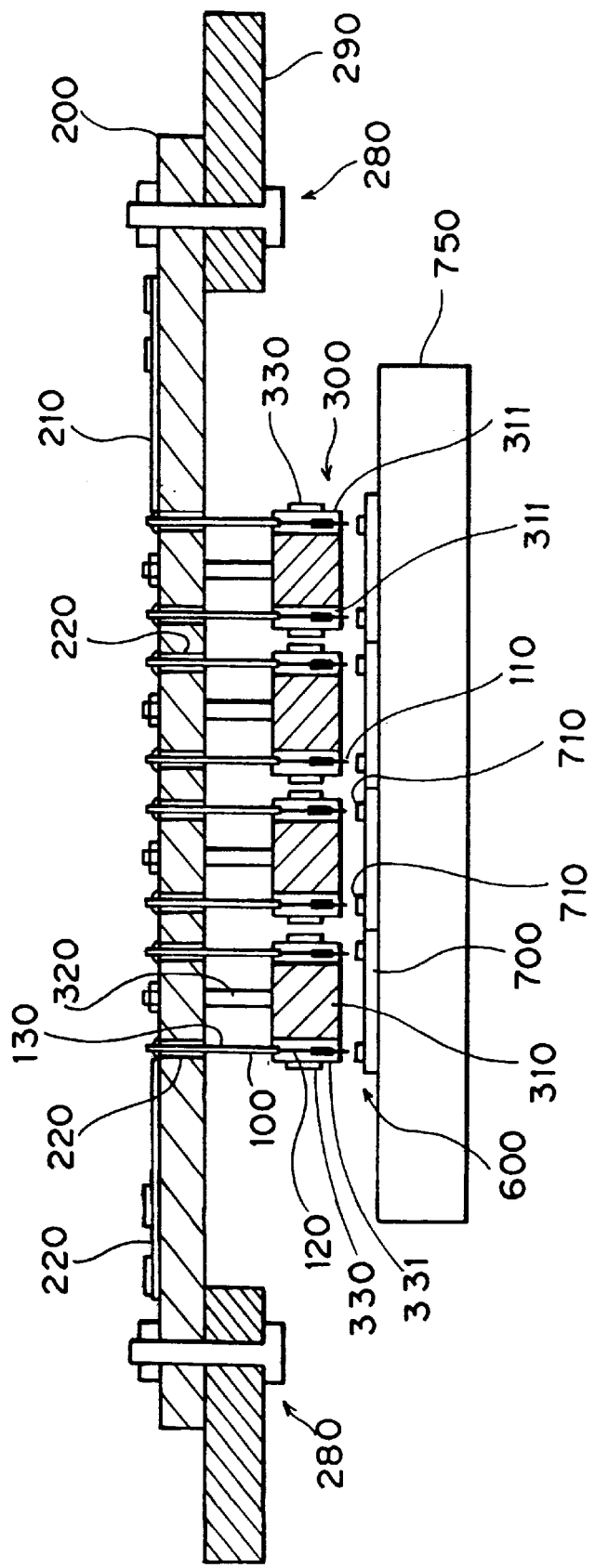
FIG. 18 shows a schematic, vertically sectioned elevation view of a fifth probe card assembly of vertically operative type belonging to the present invention.
Figure 19:
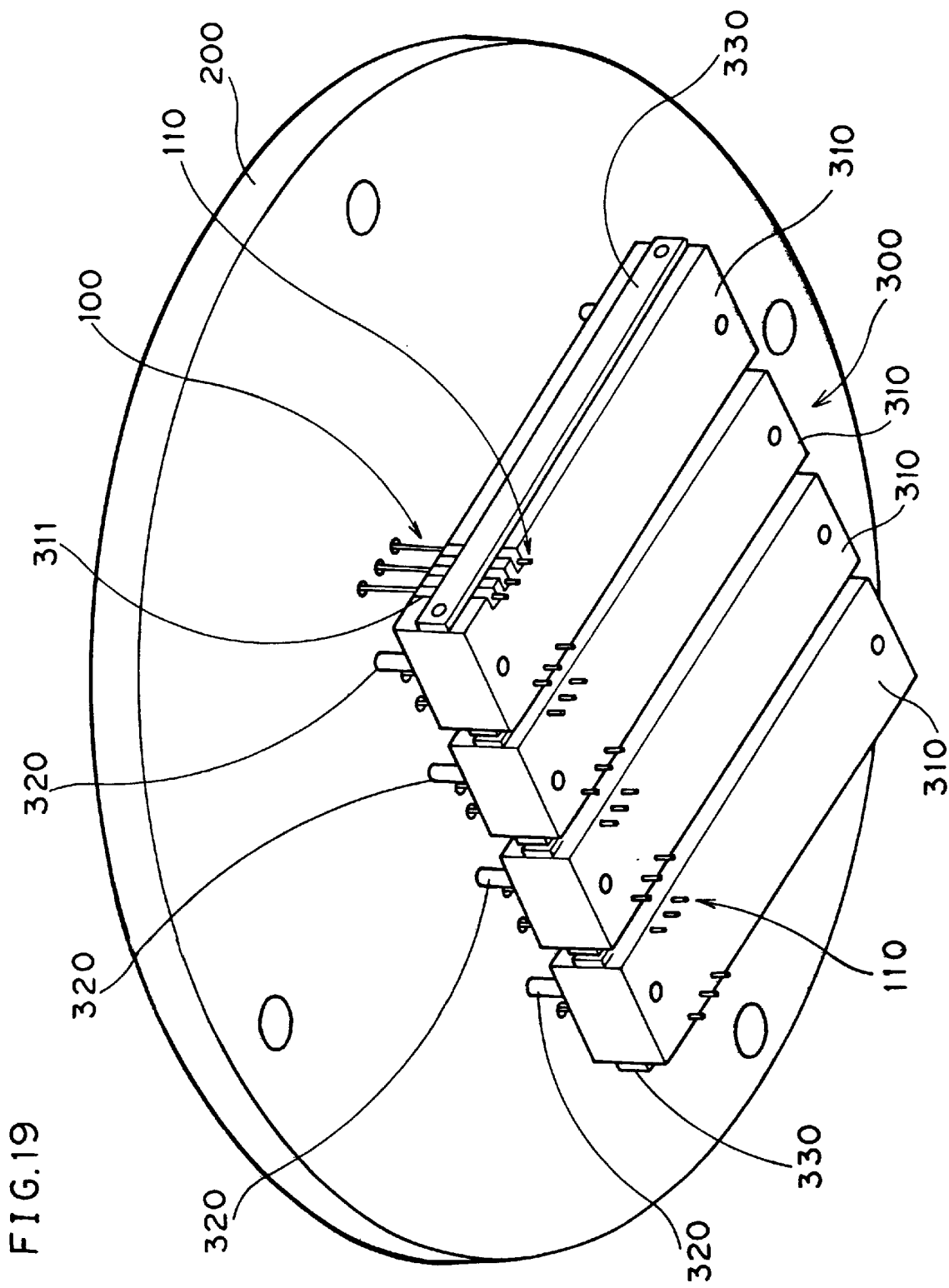
FIG. 19 shows a schematic perspective view from below of the fifth probe card assembly.

FIGS. 8 to 23 are for probe card assembly wherein five embodiment configurations are shown (FIGS. 8 to 11 for 1st, FIGS. 12 to 13 for 2nd, FIGS. 14 to 15 for 3rd, FIGS. 16 to 17 for 4th, FIGS. 18 to 23 for 5th.).

Figure 24:
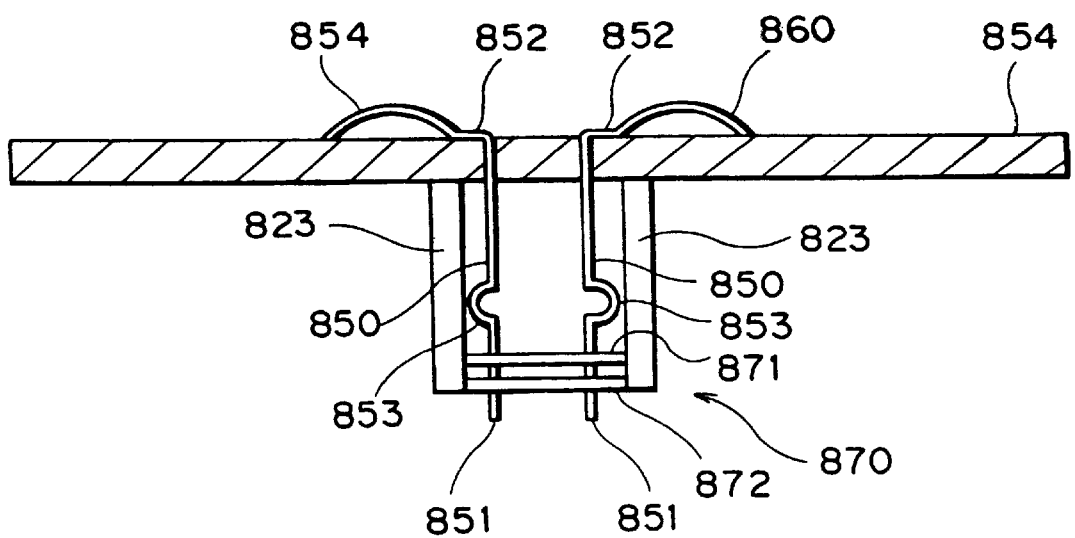
FIG. 24 shows a schematic, vertically sectioned elevation view of a probe card assembly of vertically operative type belonging to the conventional related art.
Figure 25A:
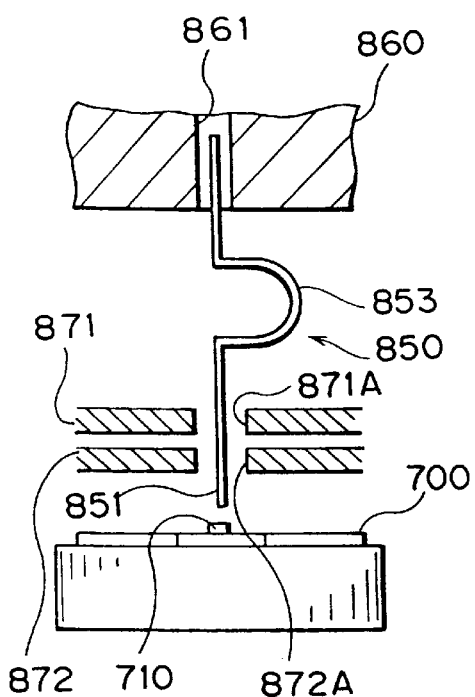
FIGS. 25A–25B shows a schematic sectional view of the conventional probe card assembly in action.
Figure 25B:
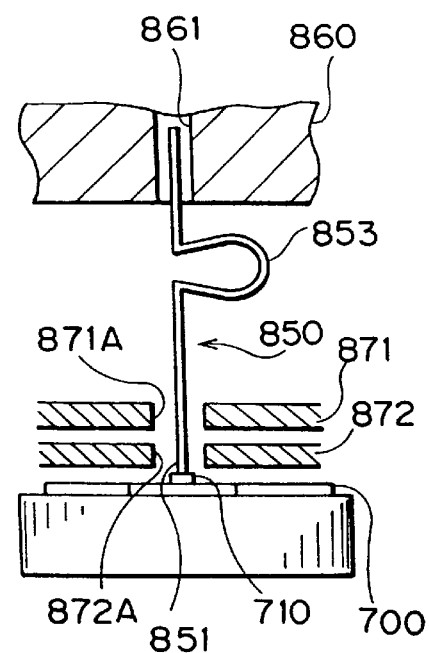

FIGS. 24 to 25 are for related art in contrast to the present invention.

DETAILED DESCRIPTIONS AND PREFERRED EMBODIMENTS OF THE PRESENT INVENTION

Features of the Probe

The inventive probes will be explained with reference to FIGS. 1 to 4. A first probe is characterized, as shown in FIG. 1, in that a probe 100 is shaped as a whole to be linear like a needle or needle work and generally round in section, and includes buckling portion 120 which is thinner or slenderized stepwise 102S than two other connected portions 110, 130 excepting the end of contact portion 110.

Another feature of the probe 100 lies in some case in an extreme end of contact portion 110, though such is not detailed in FIG. 1, but supplemented by FIGS. 5 to 7. That is, a minuscule ball is formed at that end (see FIG. 7 wherein the ball is shown not to size), and that end is covered or plated with a metal anti-oxidative, low resistive, high electrical conductive, such as Rh, Pd, Ir, Pt. The contact end covered with such a metal avoids attachment of aluminum which is a material constituting an electrode 610 and thereby contact portion 110 is less susceptible against the oxidation with a result of stabilizing the contact resistance value involved in measurements.

Manufacture of Probes Having a Minuscule Ball

Forming a minuscule ball at the extreme front end of contact portion 110 is carried out by the method of heating the end of contact portion 110 and waiting for the surface tension effecting over molten part, that is, the method of utilizing the natural action.

Heat-melting of the end of contact portion 110 is performed by irradiation of laser ray as shown in FIG. 5, or heating by the high frequency coil as shown in FIG. 6, or heating by the arc discharge.

In the case of heating with laser ray as shown in FIG. 5, specifically prepared are tungsten wires W 1000 units (0.25 mm dia.) which are nickel plated and whose contact portions 111 are sharpened with the electrolytic polishing, and these tungsten wires are arranged 20 units×50 units with 1 mm interval each other and fastened keeping the contact portions (pointed point in FIG. 5) downward.

Then, in helium atmosphere YAG laser ray L (for instance, 75 watt, beam dia.: about 0.1 to 0.2 mm) is irradiated in pulse waves focussing on contact portions 110, wherein YAG laser ray is focussed from two sources located at 45 degrees left and right. YAG lasing instantly heat-melts contact portions 110 of tungsten wires W and the lasing focus is moved to next wires, wherein amount of melting effect is controlled by pulse speed of the YAG lasing.

The heat melting by YAG lasing L prefers unoxidizing atmosphere, such as helium or nitrogen atmosphere, but air atmosphere may be employed in the case of noble metals or anti-oxidative metals.

Turning to the high frequency induction heating as shown in FIG. 6, a plurality of tungsten wires are arranged with suitable interval (normally about 1 mm) wherein a high frequency induction coil C is set to encompass adjacent to contact portions 110 of the wires (sharpened in FIG. 6) and the high frequency heating coil C is activated from the high frequency source to heat-melt contact portions 110.

Further, in place of lasing or high frequency heating, the arc discharge heating may be employed to heat-melt contact portions 110 of the tungsten wires W, wherein carrying out in inert gas atmosphere is desired.

So far the art of forming a minuscule ball by utilizing the natural surface tension has been described. In place, available alternative art is, as shown in FIG. 7, that, minuscule balls 150 are prepared in advance, and these ball materials 150 are heated and fused to tungsten wires or berium copper wires.

Specifically, a tungsten wire (0.5 mm dia.) is sharpened by a rotary whetstone to make an end portion so sharp, and a minuscule ball 150 (70 microns dia.) is fuse-attached to the sharpened point by heating in oxygen-hydrogen flame.

Otherwise is direct fusion method, that is, holding a tungsten wire having sharpened point in contact with a minuscule ball 150 and in the state held in such way, a current is run through two contactant things to fuse each other. This method is suitable to commercial scale manufacture and will find lower cost.

Further Description of the Probe

Turing back to probe 100, significance of buckling portion 120 will be explained with reference to FIG. 2. As noted before, buckling portion 120 is made thinner or slender stepwise 120S than other two portions excepting the end of contact portion 110. For this reason, upon effecting force at contact portion 110, buckling portion 120 will buckle as is expected and shown in FIG. 2, and such property is imparted by polishing by whetson or electrolytic polishing.

The connecting portion 130 is part for connecting or fastening probe 100 with wiring pattern 310. This connecting portion 130 is formed to be linear from buckling portion 120 (see FIG. 1 or 2), and when mounted in place with board 200 (see FIGS. 16 to 18 or FIG. 21), connecting portion 130 will extend partially over board 200. This extension may be clipped by a tool (not shown), such as about 1 to 1.5 mm.

Probe 100 has typically dimensions of buckling portion 120 about 40 microns dia., 3 mm length; contact portion 110 about 2.5 mm length; connecting portion 130 about 3.5 mm length. In operation as will be described later, if the overdrive is 0.1 mm, wherein the overdrive is defined as vertical push-in length from an initial contact point onto an electrode with the pointed end of the contact portion, contact pressure of 10 g/cubic cm to 20 g/cubic cm is obtained, and when the contact pressure is at 15 g/cubic cm, the contact resistance between the electrode and probe 100 is estimated about 0.5 ohm.

The present invention does not exclude probes 100 having only sharpened point at the end of contact portion 110 with no minuscule ball 150 as described, so far as the buckling portion 120 functions to give a predetermined contact pressure stably under overdrive condition.

Description of Vertically Operative Type Probe Card Assembly Employing such Probe as Explained above Description based on FIGS. 8 to 11

A first embodiment of probe card assembly of vertically operative type employing such probe as explained above will be described with reference to FIGS. 8 to 11. In the following, the term "probe card assembly of vertically operative type" will sometimes be shortened to "this type assembly", or "the present assembly", or "the assembly" if such abbreviation is thought to be instantly understandable.

The first embodiment of probe card assembly of vertically operative type features in including: a plurality of probes 100 having buckling portion 120 to bend or to buckle, upon a contact onto electrode 710 of semiconductor integrated circuit 700 at the end of its contact portion 110; and first board 400 provided with first wiring pattern 420 connected with connecting portion 130 of probe 100; and second board 500 removably fastened with first board 400 and provided with second wiring pattern 520 connected with first wiring pattern 420; and housing members 600 mounted with second board 500 for controlling contact portion 110 of probe 100; wherein probe 100 has a generally round section and its buckling portion 120 is thinner than other portions excepting the end of contact portion 110, and contact portion 110 and buckling portion 120 are formed to be linear, and wherein one through opening 510 is provided with second board 500 for inserting through probes 100 mounted with first board 400 in unitary group as a whole.

First board 400 is an insulative board provided with a plurality of through holes 410 correspondent to probes 100 in number, and through holes 410 are provided for admitting connecting portions 130 of probes 100 to insert through, and because of linear shape of the probes, these holes 410 are arranged to directly align to positional pattern of electrodes 710 of semiconductor integrated circuit 700 to be tested.

Figure 10:
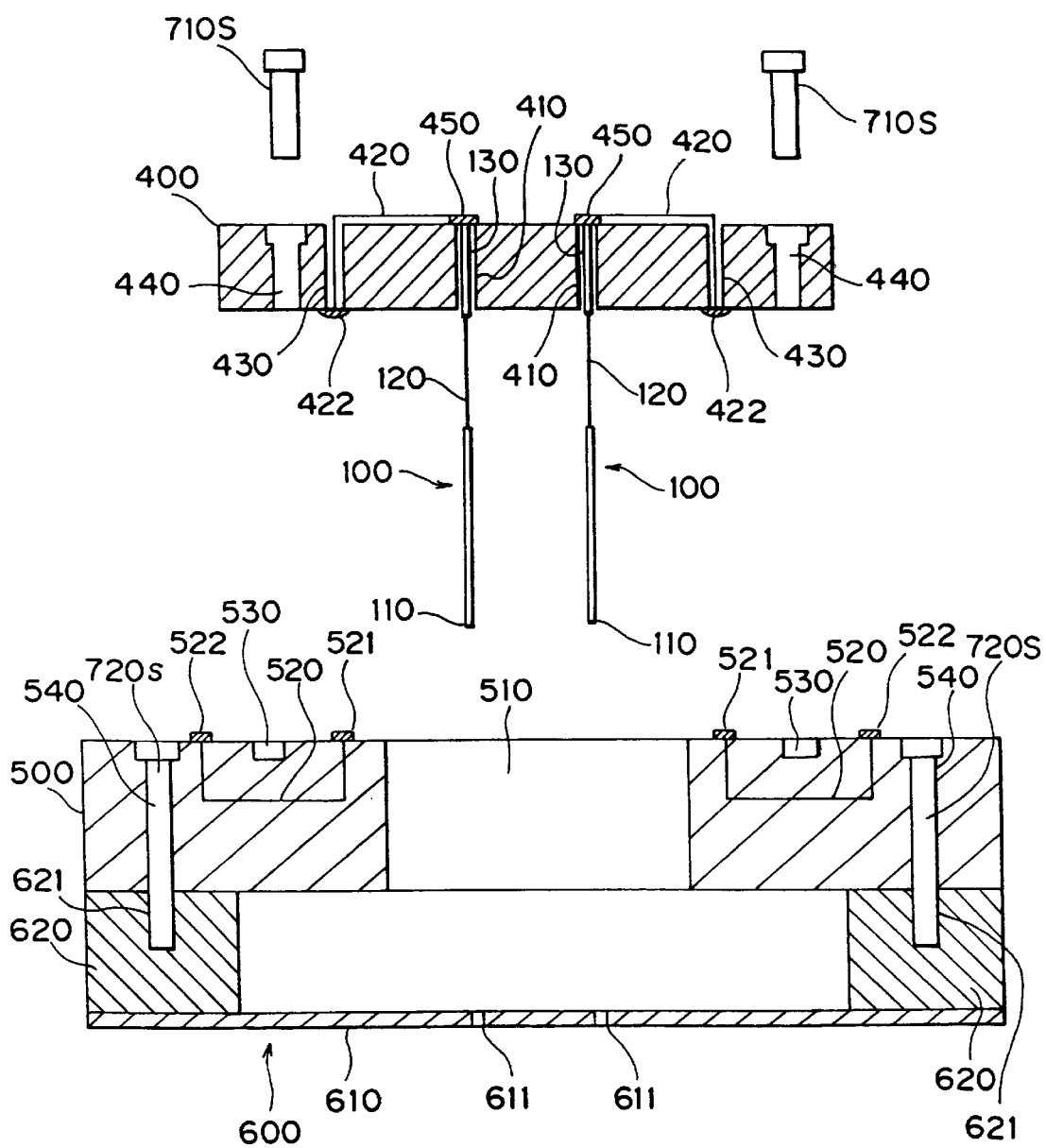
FIG. 10 shows a schematic, exploded view of the first probe card assembly.
Figure 11:
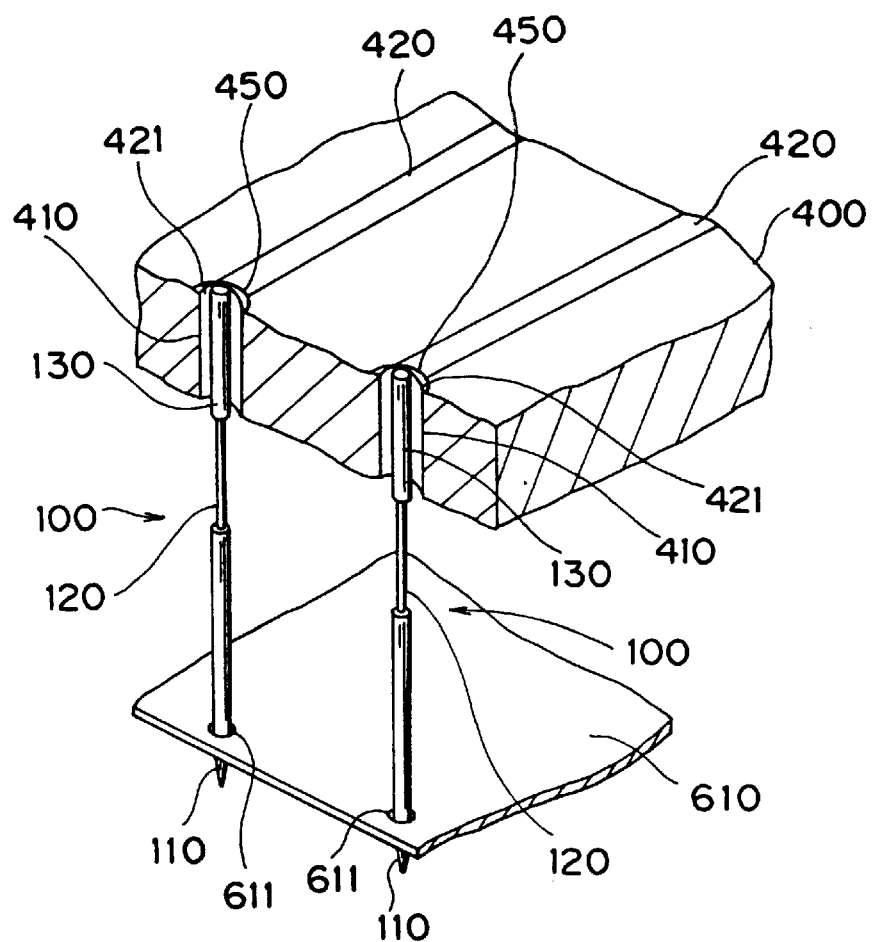
FIG. 11 shows a partially cutaway, perspective view of key portions of the first probe card assembly.

On upperside of the first board 400, first wiring pattern 420 formed of etched copper foil is provided for electrically connecting electrodes 710 of semiconductor integrated circuit 700, with aid of probes 100, to a tester (not shown), and its terminal encompasses through hole 410 in the form of land portion 421, to which portion 421 the connecting portion 130 of probe 100 is connected or bonded with solder 450. The other terminal of first wiring pattern 420 extends through other through holes 430 and leads out of the underside of first board 400, and in turn forms bump 422 there, as shown in FIG. 10.

First board 400 thus described has at its corners fastening holes 440 for removably fastening second board 500.

Second board 500 is provided with one central opening 510 for inserting through probes 100 mounted with first board 400. This opening 510 permits all probes 100 constituting the present assembly to extend through, that is to say that all through holes 410 provided in first board 400 are positioned so that all these holes 410 are ranged laterally inside one opening 510 of second board 500 after second board 500 is fastened with first board 400.

Second board 500 is made from lamination of glass-reinforced epoxy resin plates or polyimide films, wherein second wiring pattern 520 is formed in multilayers, and second wiring pattern 520 in the multilayer form has one terminal 521 exposed on the surface of second board 500 in a form of land portion, wherein its exposure is located to align to bump 422 derived from first wiring pattern 420 as described above, upon second board 500 being fastened with first board 400. Thus fastening second board 500 with first board 400 brings about electrical connection between first and second wiring patterns.

Another end 522 of second pattern 520 is exposed on second board 500 in the form of land portion, and its exposed position is out of first board as fastened, that is, the position where the other end 522 of second wiring pattern 520 is exposed on second board 500, is determined to be at an outer position where first board 400 has not occupied after first board 400 and second board 500 were fastened.

Second board 500 has fastening holes 530 aligning to fastening holes 440 of first board 400. That is, upon laying second board 500 on first board 400 at the predetermined position, two fastening holes 440, 530 are agreed so that bolt or screw 710S as fastening means will fasten first board 400 with second board 500 removably.

Thus the end of first wiring pattern 420 in the form of bump 422 located on the underside of first board 400 is connected to end 521 of second wiring pattern 520 at its land portion on the upperside of second board 500.

In addition to fastening holes 530, second board 500 has through holes 540 for fastening housing materials 600. Housing materials 600 include guide panel 610 provided with through holes 611 at positions aligning to probes 100, and spacer 620 for fastening guide panel 610 with the underside of second board 500.

Spacer 620 has fastening holes 621 positionally aligning to holes 540 of second board 500 as noted. Second board 500 and housing materials 600 are fastened with screw 720S as fastening means by fastening into holes 540, 621.

The operation for measuring electrical characteristics of semiconductor integrated circuit 700 by the present assembly as structured will be explained.

The present assembly is set up positionally right above lifter 750 on which a wafer (objective for measurement) is fixed or disposed in place by vacuum sucking. Lifter 750 is moved upward from its initial position with the wafer attached, wherein a substrate lifting mechanism (shown under lifter 750 in dotted lines in FIG. 8) is acted on along vertically as shown by two headed arrow mark (In the following drawings the substrate lifting mechanism is abbreviated from showning) and ends of contact portions 110 of probes 100 come to contact with electrodes 710 of semiconductor integrated circuit formed on the wafer, and then an overdrive is acted by lifting up lifter 750 a little distance, by such overdrive action probes 100 are pressed from over and under, and buckling portions 120 of probes 100 buckle to realize a situation shown in FIG. 9. Thus desired predetermined contact pressure is maintained. In this situation, contact portions 110 of probes 100 contact and push into electrodes 710 vertically without undesirable slipping or sliding on electrodes 710 and in turn correct measurements are accomplished.

When the measurements of electrical characteristics of semiconductor integrated circuit 700 are finished, lifter 750 is lowered to its initial position, and a new wafer is prepared on lifter 750 by vacuum sucking.

Turning to the explanation of how some probes are exchanged in the present assembly thus structured.

First solder mass 450 which has connected or bonded a probe 100 to be exchanged with first wiring pattern 420 is removed. Thereby physically the probe of interest and first board 400 are separate or disconnected. The probe of interest is pulled away upward out of first board 400, with a result that removal of the probe of interest is complete.

A new or replacement probe 100 is incorporated to this assembly. First insert new probe 100 into the assembly through the through hole 410 of first board 400 from above. Therein contact portion 110 is certainly inserted through the through hole 611 of guide panel 610 which is aligned to through hole 410 above. The lowest point of contact portion 110 of new probe 100 is correctly positioned or uniformized so as to be at the same level as other probes 100, and then the end of connecting portion 130 is connected or bonded with land portion 421 of first wiring pattern 420 by solder 450.

In the case where many probes 100 requires the exchange after the use for determined period, it is permitted to replace all probes together with first board 400. In this case, as shown in FIG. 10, the removal of screw 710 permits disengagement of first board 400 from second board 500 and the replacement of a new first board 400 mounted with new probes is allowed, wherein electrical connections between the new first board 400 and the old second board 500 will be simultaneously accomplished including extension to the tester (not shown) outside the assembly, with aid of first wiring pattern 420 and second wiring pattern 520.

Description based on FIGS. 12 and 13

Another embodiment of vertically operative type probe card assembly will be explained with reference to FIGS. 12 and 13. This second assembly differs in the structure of second board 500. That is, second board 500 in the first embodiment as noted before is structured to include one large central opening encompassing all probes equipped inside thereof or all probes extend through one opening at central position. Instead, second board 500 of the second embodiment is provided with separate through holes for respective probes. Therefore, the second embodiment is different from in this point and in other points much similar to the fist one.

Specifically, through holes 510 of the second embodiment are positionally aligned to electrodes 710 of semiconductor integrated circuit 700. That is, through holes 510 of second board 500 are positioned or arranged to align to through holes 410 of first board 400 as well as through holes 611 of guide panel 610 vertically.

Therein assumed is that the thickness of second board 500 is designed to have an enough or abundant length to include buckled portions 120 of probes 100 within the thickness length.

With buckling portions 120 of probes 100 being buckled subsequent to contact of contact portions 110 for this second embodiment, respective buckling portions 120 are controlled or immobilized by through holes 510 of second board 500 as well as those 611 of guide panel 610, so that contacts between buckled portions 120 of adjacent probes 100 are certainly avoided. Therefore, denser arrangement of probes 100 is permitted. The designated FIGS. 12 and 13 illustrate two probes, though, principally proved.

The procedure in the exchange work of probes 100 is much similar to the description as noted above as to the first embodiment. Specifically, first solder mass 450 is removed to disconnect probe 100 to be exchanged from first wiring pattern 420 and then probe 100 of interest is pulled away upward out of first board 400. Thus completely removed from the assembly.

A new or replacement probe 100 is incorporated into this assembly. First insert the new probe 100 into the assembly through the through hole 410 of first board 400 from above. Therein contact portion 110 is certainly inserted through the through hole 611 of guide panel 610 which is aligned to through hole 410 above. The lowest point of contact portion 110 of the new probe 100 is correctly positioned or uniformized so as to be heightwise at the same level as other probes 100, and then the end of connecting portion 130 is connected with land portion 421 of first wiring pattern 420 by solder 450.

In the case where many probes 100 require the exchange after the use for determined period, it is permitted to replace all probes together with first board 400. in this case, the removal of screw 710S permits disengagement of first board 400 from second board 500 and replacement of a new first board 400 mounted with new probes is allowed, and engagement of the new first board 400 should include inserting respective probes 100 into through holes 510 of second board 500 as well as through holes 611 of guide panel 610.

In this assembly, through holes 510 of second board 500 are added to through holes 410 of first board 400, and thereby the work of inserting probes 100 into through holes 410 of first board 400 will facilitate subsequent work of inserting the ends of contact portions 110 of probes 100 into through holes 611 of guide panel 610. This is unique effect with this embodiment and as a whole the exchange work of probes is facilitated.

In the embodiment of this type assembly, as shown in FIG. 13, it is permitted to design buckling portion 120 of probe 100 so as to take position inside a connected hole which extends aligningly both first and second boards 400, 500, different from the case as shown in FIG. 12, wherein through hole 510 for buckling portion 120 is formed only within the thickness of second board 500.

In the case of FIG. 13, through hole 410 of first board 400 is jointed with through hole 510 of second board 500 with independence from adjacent other joint holes, so that probes 100 inserted in adjacent holes are avoided from mutual contact in their buckled state, and choice is available as to positioning buckling portion 120 either in through hole 410 of first board 400 or in through hole 510 of second board 500 and in turn more freedom in determining what length of buckling portion 120 is obtained in adjusting resultant contact pressures to be realized.

Effect of facilitating the exchange work of probes 100 is awarded in much the same way as in the case of embodiment as noted before.

The descriptions as noted above assume that guide panel 610 of housing materials 600 is made of one ply, but the present invention is not limited so, and it may be two or more, wherein more plies or layers will protect the ends of contact portions 110 of probes 100 more certainly from possible positional deviations.

Description based on FIGS. 14 and 15

Another next embodiment of vertically operative type probe card assembly will be explained with reference to FIGS. 14 and 15.

This type assembly features in including: a plurality of probes for measurement 100A provided respectively with buckling portions 120A which will buckle, upon contacting onto electrode 710 of semiconductor integrated circuit 700 at the end of its contact portion 110A; first board 900A provided with wiring pattern 910A connecting to the end of connecting portions 130A of probes for measurement 100A;

second board 900B superjacent to and fastened removably with first board 900A; a plurality of probes for circuit connection 100B provided respectively with buckling portions 120B which will buckle, upon contacting onto wiring pattern 910A at the end of contact portion 110B when inserted into through hole 901B provided with second board 900B.

The probe for measurement (this term will often be shortened to "measurement probe") 100A and the probe for circuit connection (this term will often be shortened to "connection probe") 100B are manufactured from tungsten or like metal wire, and are shaped generally in L-letter. That is, much similar to a probe as shown in FIG. 3 or 4, measurement probes 100A and connection probes 100B each include contact portion 110A, 110B having sharpened front end and connecting portion 130A, 130B, and buckling portion 120A, 120B which is intermediate between contact portion 110A, 110B and connecting portion 130A, 130B, wherein connecting portion 130A, 120B is generally bent at right angles against other portions. Such probes for measurement and circuit connection have generally round section.

The front end of contact portion 110A, 110B is plated by anti-oxidizing and low resistive conductive metal, such as Rh, Pd, Ir, Pt. The plating by such metal at the front end of contact portion 110A, 110B imparts more avoidance against attaching with aluminum which is a metal constituting electrode 610, so that contact portion 110A, 110B is of anti-oxidation with a result of stabilizing the contact resistance value.

Contact portion 120A, 120B is formed to be thinner or slenderized than other portions excepting the end of contact portion 110A, 110B. For this reason, pressure acting on contact portion 110A, 110B from over or from under will buckle or bend buckling portion 120A, 120B as shown in FIG. 14. Whetstone polishing or electrolytic polishing is available for slenderizing buckling portion 120A, 120B.

Connecting portion 130A is a part for connecting the measurement probe 100A to wiring pattern 910A of first board 900A, and this portion 130A includes vertical sub-portion 131A which extends from buckling portion 120A linearly and lateral sub-portion 132A which bends generally at right angles to extend laterally, so that lateral sub-portion 132A is designed to extend with respect to contact portion 110A as well as buckling portion 120A.

Connecting portion 130B is a part for connecting the connection probe 100B to wiring pattern for connection 910B of second board 900B, and this portion 130B includes vertical sub-portion 131B which extends from buckling portion 120B linearly and lateral sub-portion 132B which bends generally at right angles to extend laterally, so that lateral sub-portion 132B is designed to extend with respect to contact portion 110B as well as buckling portion 120B.

With measurement probes 100A and connection probes 100B thus designed, length of vertical portions from bend point 133A, 133B to the end of contact portion 110A, 110B is set to be the same with all of both probes 100A, 100B. Accordingly, when measurement probes 100A are inserted or mounted into through holes 901A, heightweise positions of the ends of contact portions 110A of respective probes 100A are made uniform, and in the same way, when connection probes 100B are inserted or mounted into through holes 901B, heightwise positions of the ends of contact portions 110B of respective probes 100B are made uniform.

First board 900A is insulative board and provided with a plurality of through holes 901A at positions to align to arrangement of measurement probes 100A, that is, through hole 901A serves as a space for staying vertical sub-portion 131A of connecting portion 130A of measurement probe 100A. In addition, this board 900A has at its corners through holes 902A for fastening second board 900B.

On the upperside of first board 900A, predetermined wiring pattern 910A made from copper foil, for instance, is formed by the etching, for instance. Wiring pattern 910A is, as shown in FIG. 14, formed into land portion around through hole 901A. Therein length between through hole 901A and wiring pattern 910A is set to be a little shorter than real length of lateral sub-portion 132A of measurement probe 100A for reassuring connection to measurement probe 100A.

Therein wiring pattern 910A of first board 900A may be formed of only land portion, or of land and wiring portions. As described later, Such formation is selective for the reason that, the arrangement of measurement probes 100A on first board 900A is necessary to be changed according to a change of arrangement of electrodes 610 of semiconductor integrated circuit 600, though, probes 110B from second board 900B and land portions formed on first board 900A are fixed in positional relationship, and therefore wiring pattern 910A will have variable length on first board 900A.

Figure 8:
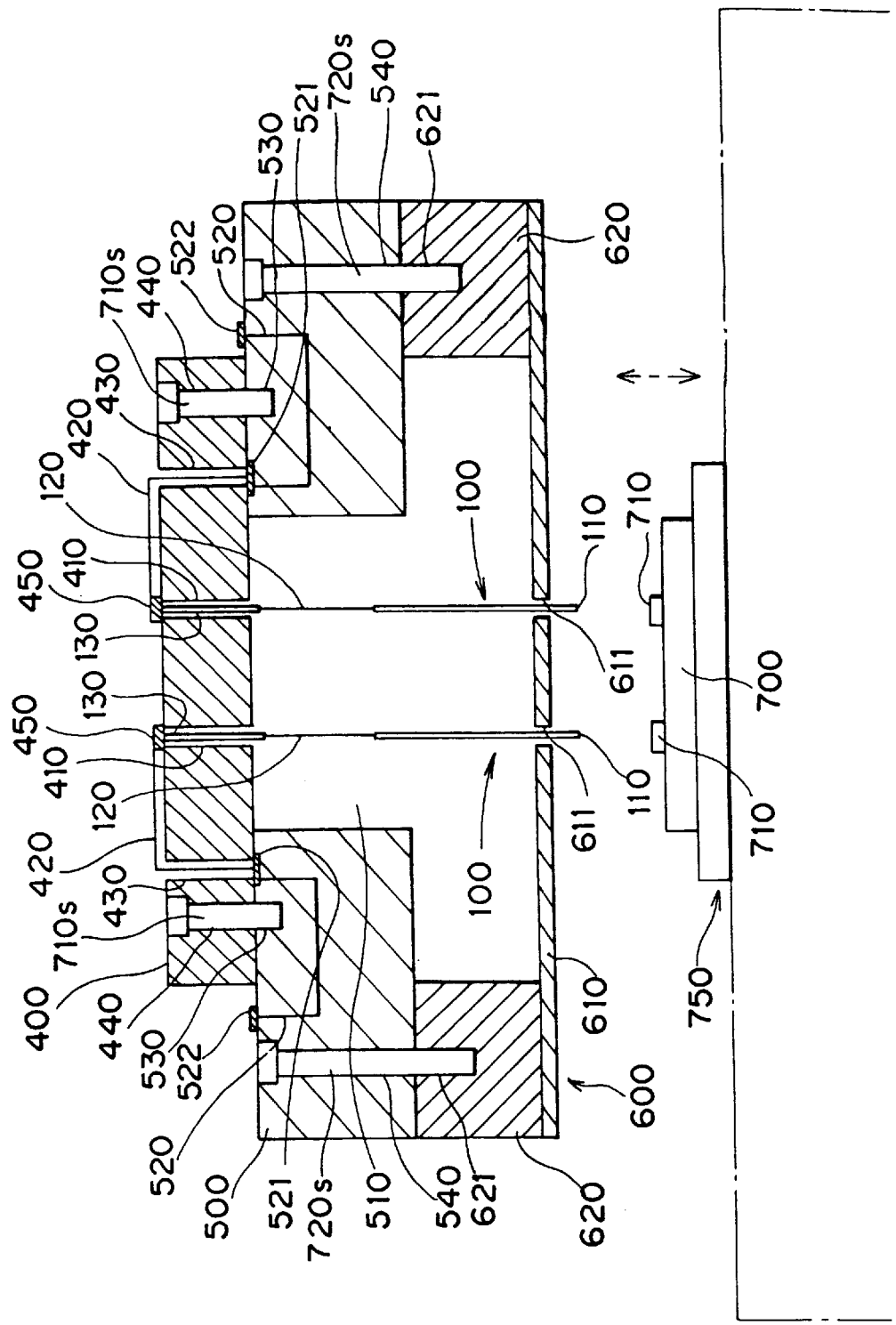
FIG. 8 shows a schematic, vertically sectioned elevation view of a first probe card assembly of vertically operative type belonging to the present invention.
Figure 9:
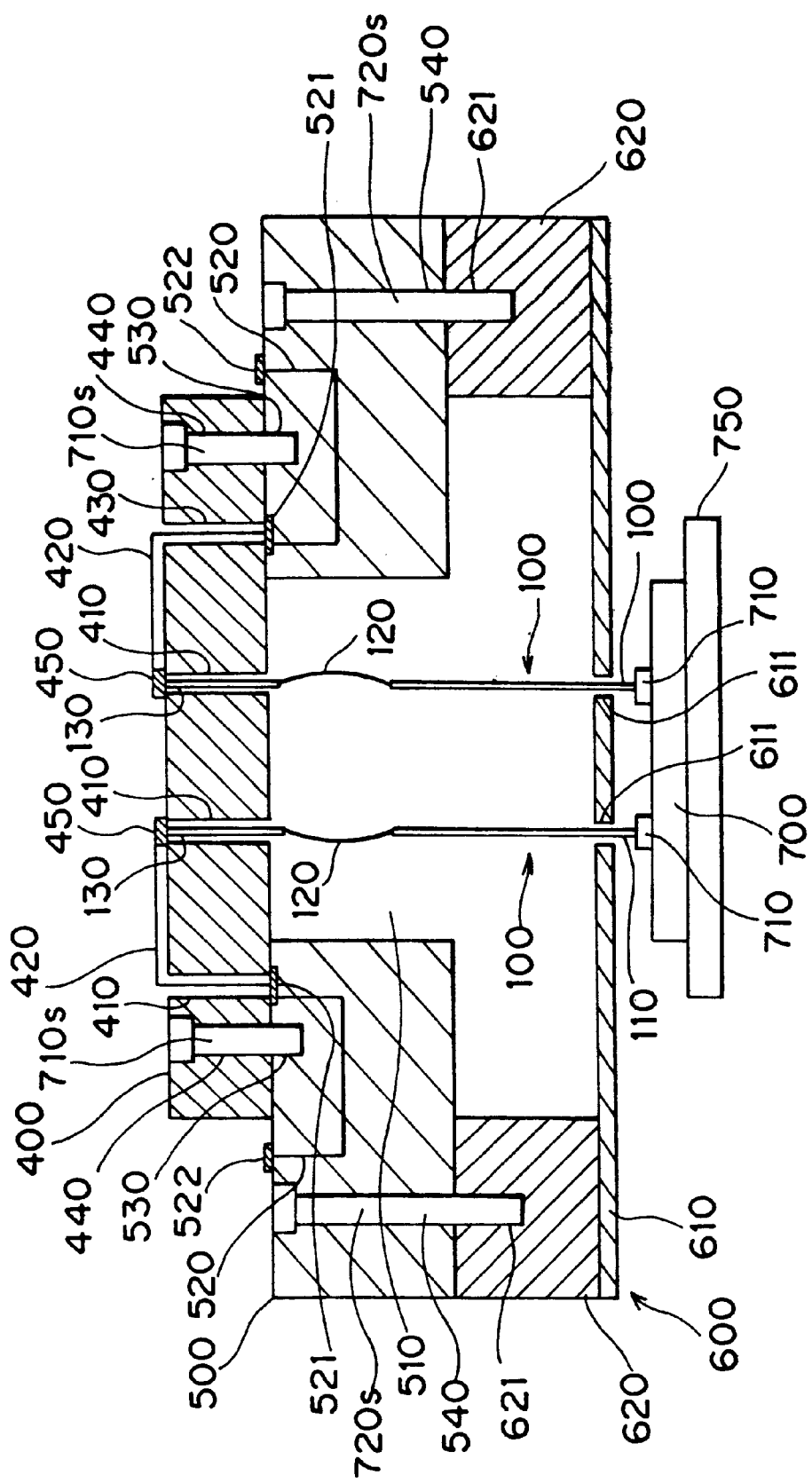
FIG. 9 shows a schematic view of the first probe card assembly in action.

Then, on underside of first board 900A, probe housing 200A is mounted, which is similar to the housing materials 600 as shown in FIGS. 8 and 9, and intended to support or guide contact portions 110A of measurement probes 100A and which includes guide panel 210A provided with through holes 211A and spacer 230A for fastening guide panel 210A with first board 900A. Through holes 211A of guide panel 210A are arranged to align to positional pattern of electrodes 610 of semiconductor integrated circuit 600 for measurement.

That is, first board 900A, and measurement probes 100A and probe housing 200A fastened with first board 900A are structured to align to positional pattern of electrodes 610 of semiconductor integrated circuit 600 for measurement, but wiring pattern 910A is independent of positional pattern of electrodes 610 and then fixed. See two paragraphs above.

Referring to second board 900B, this board is made from lamination of glass-reinforced epoxy resin plates or polyimide films, wiring is structured in multilayers (not shown) and is provided with through holes 901B which are for inserting connection probes 100B, wherein the end of contact portion 110B of connection probe 100B is made to extend out of underside of second board 900B. In addition, second board 900B has at corners through holes 902B for fastening first board 900A.

On upperside of second board 900B, predetermined wiring pattern for connection 910B formed of copper film by the etching, for instance, is present for connecting lateral sub-portion 132B of connection probe 100B. The end of wiring pattern for connection 910B extends its land portion 911B to a position adjacent to through hole 901B, wherein length between through hole 901B and land portion 911B is made a little shorter than real length of lateral sub-portion 132B of connection probe 100B for reassuring connection with connection probe 100B.

Wiring pattern for connection 910B mounted on second board 900B is connected to multilayer wiring (not shown) in second board 900B, and this multilayer wiring is connected to a connector (not shown) and in turn to the tester, out of the drawing and also not shown. That is, communication route for signals from semiconductor integrated circuit 600 to the tester is through: measurement probe 100B, wiring pattern for connection 910B, multilayer wiring and then to connector.

First board 900A and second board 900B are fastened by means 810 formed of bolt-nuts, for instance, and inbetween pad spacers 950 formed of resilient material, for instance, rubber pad spacer, is applied. This pad spacer 950 is for reassuring electrical connection between contact portion 110B of connection probe 100B and wiring pattern 910A of first board 100A. Specifically, contact pressure between contact portion 110B and wiring pattern 110B will be suitably adjusted by deformation of the pad spacers 950 between first board 900A and second board 900B.

Figure 20:
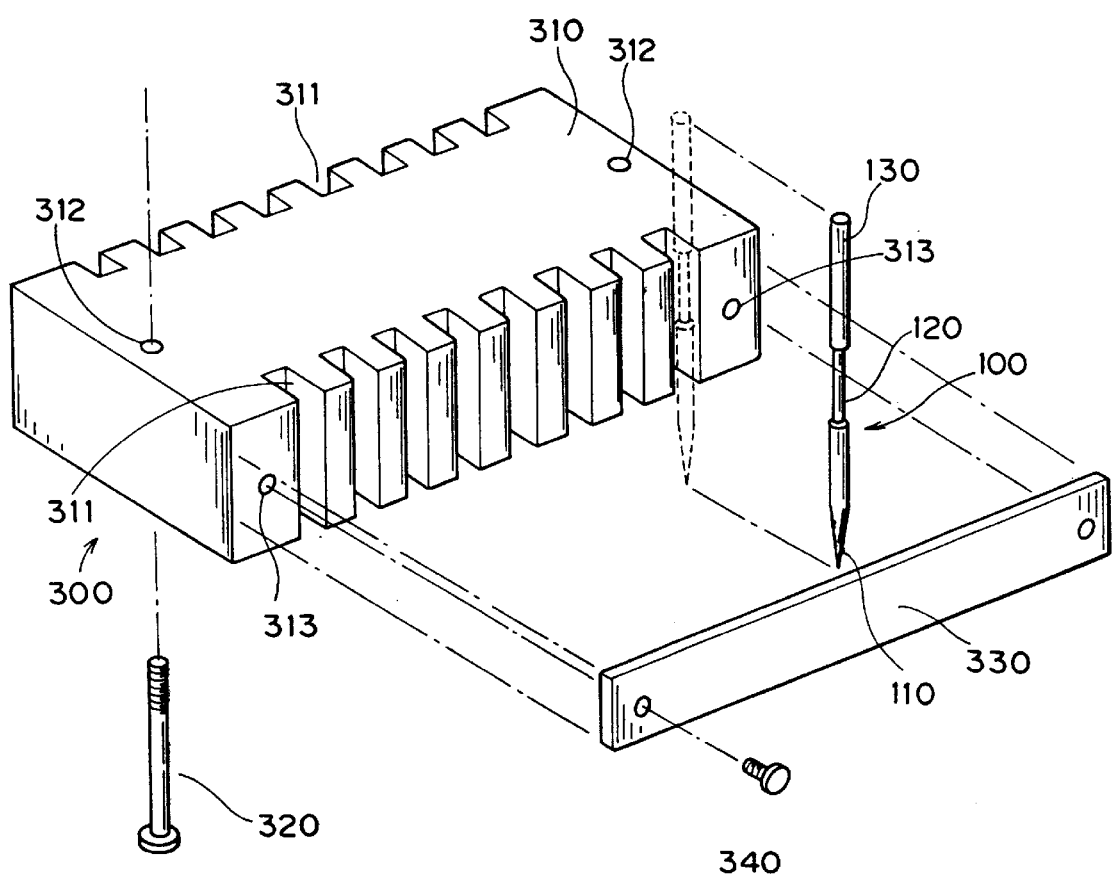
FIG. 20 shows a schematic, exploded perspective view of a supporter assembled in the fifth probe card assembly.
Figure 21:
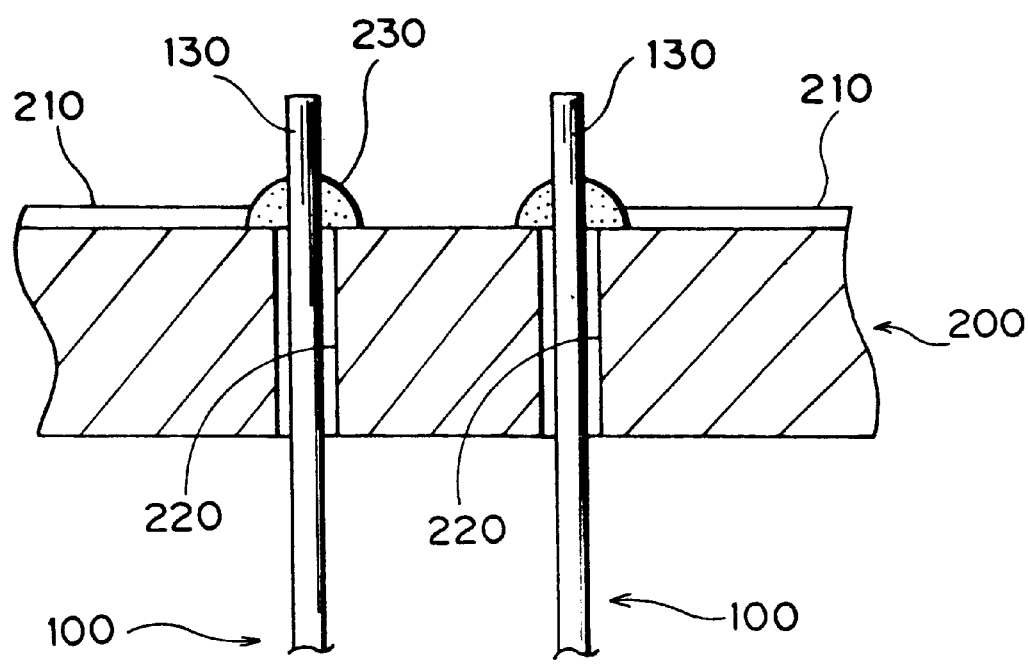
FIG. 21 shows a schematic sectional view explaining connection between a board included in the fifth assembly and a connecting portion of the probe.

Upon fastening first board 900A with second board 900B, connection probe 100B is pressed at its contact portion 110B onto wiring pattern 910A. For this cause, connection probe 100B buckles, as shown in FIG. 20, at its buckling portion and thereby suitable contact pressure is maintained between contact portion 110B and wiring pattern 910A.

The present assembly thus structured is applied to measure electrical characteristics of semiconductor integrated circuit 700, meanwhile contact pressure between electrodes 710 and measurement probe 100A is maintained by buckling action of the buckling portion 120A of measurement probe 100A.

The present assembly thus described will cause damage with measurement probes 100A. Such damaged probes for measurement 100A are exchanged by procedure as explained below.

First, second board 900B is removed from first board 900A and thereby the upperside of first board 900A is exposed. Then, solders which have connected measurement probes 100A with wiring pattern 910A are removed. At the same time, adhesive (not shown) which adheres measurement probes 100A with first board 900A in through holes 901A are cleared out. Thus, measurement probes 100A to be exchanged are physically separated from first board 900A and such probes are pulled away upward from first board 900A. Thus, measurement probes to be exchanged 100A are completely removed.

New or replacement probes will be incorporated into the present assembly. First, insert a new measurement probe 100A with contact portion front into through hole of first board 900A from above. At this time, insert contact portion 110A into the predetermined through hole 221A of guide panel 210A certainly. Place lateral sub-portion 132A of connecting portion 130A on predetermined wiring pattern 910A. Apply adhesive (not shown) at bending point 133A between lateral sub-portion 132A and vertical sub-portion 131A and fit measurement probe 100A on first board 900A. Following this, connect lateral sub-portion 132A with wiring pattern 910A by soldering (not shown). Thus, contact portion 110A of the new measurement probe 100A is mounted on first board 900A heightwise at the same level with contact portions 110A of other measurement probes 100A.

Upon finishing the exchange of damaged measurement probes 100A, second board 900B is fastened with first board 900A. Then, in the case of damage with connection probe 100B of second board 900B, exchange is carried out after removal of second board 900B from first board 900A. Therein, connection probe 100B is far unlikely to be damaged since its buckling portion 120B does not repeat buckling actions each measurement time, different from measurement probe 100A.

The present assembly as described needs the change of components including first board 100A and down to suitable ones, in order to measure electrical characteristics of semiconductor integrated circuit 700 having different wiring pattern of electrodes 710.

Therein, measurement probes 100A and connection probes 100B are suitable to be coated over its surface with such metal as gold, silver, copper or aluminum having low electrical resistance, in order to improve transmission of high frequency signals of interest or to avoid attenuation thereof.

Description based on FIGS. 16 and 17

Further next embodiment of vertically operative type probe card assembly will be described with reference to FIGS. 16 and 17. This type assembly features in including: a plurality of probes 100 including buckling portion 120 which will buckle, upon contacting the front end of contact portion 110 onto electrode 710 of semiconductor integrated circuit; board 490 including wiring pattern 491 to be connected to probe 100 at least on its upperside; housing members 480 mounted on underside of board 490 for housing probes 100; wherein probe 100 is generally round in section, and its buckling portion 120 is slender than other portions excepting the end of contact portion 110, and contact portion 110 and buckling portion are shaped to be linear; and wherein board 490 is provided with through holes 492 for inserting through probes 100, and housing members 480 include two guide panels 481 provided with through holes 482 for inserting through probes 100, and mounting members (not shown, but similar to the spacer in previous embodiments) for fastening guide panels 481 with board 490.

Board 490 is a laminated board, and into through holes 492, probes 100 are inserted and stayed with connection portion 130 kept partially uninserted about 1.0 to 1.5 mm (about a length for catching by clipping tool) out of the upperside, and probes 100 are fixed with through holes 492 by soldering.

Guide panels 481 include two panels vertically separate and laterally held. Through holes 482 provided with guide panels 481 and through holes 492 provided with board 490, and electrodes 710 of semiconductor integrated circuit 700 are aligned positionally. Hence, one unit of probe 100 is designed to extend through three through holes 481(twice), 492 straightly. As noted, two guide panels upper and lower are provided, so that buckling at buckling portion 120 will hardly cause positional deviation at the end of contact portion 110, that is, positional deviation of contact portion 110 relative to electrode 710 will be effectively held minimum.

Operations and features included in the present assembly are similar to those described in previous embodiments and hence abbreviated.

Description based on FIGS. 18 to 23

Still further next embodiment of the vertically operative type probe card assembly will be described with reference to FIGS. 18 to 23.

This embodiment of vertically operative type probe card assembly features in including: a plurality of probes 100 each provided with contact portion 110, connecting portion 130, and buckling portion 120 which will buckle, upon contacting the end of contact portion 110 to electrode 710 of semiconductor integrated circuit 700 as explained so far; board 200 provided with wiring pattern 210 to which connecting portion 130 of probe 100 is connected; wherein each probe 100 is generally round and buckling portion 120 thereof is slender than other portions excepting the end of contact portion 110.

Board 200 is made from insulative material and is provided with a plurality of through holes 220 to align positionally to arrangement of probes 100. Connecting portion 130 of probe 100 is inserted into through hole 220.

On the upperside of board 200, predetermined wiring pattern 210 made from copper foil for instance, is formed by the etching for instance. Wiring pattern 210 is electrically connected to the tester (not shown) provided outside the drawing through probes 100 from electrodes 710 of semiconductor integrated circuit 700, and wiring pattern 210 extends its end around through hole 220 in the form of land portion, as shown in FIG. 8.

On the underside of board 200, supporting members 300 for supporting probes 100 are mounted including probe supporters 310 and fastening means 320 for fastening removably probe supporters 310 to the underside of board 200. Probe supporter 310 is made from insulative material including ceramics such as alumina, nitrided silica, nitrided aluminum, or various kinds of plastics.

Probe supporter 310 is generally shaped in a laterally elongated rectangular solid, at whose longer two edges a plurality of (8 units shown in FIG. 20) vertical recesses or flutes 311 are formed to stay or hold probe(s) 100 in each flute. Intervals between flutes 311 are determined to align to electrodes 710 of semiconductor integrated circuit 700.

Width of flute 311 is designed to be somewhat larger than diameter of connecting portion 130 of probe 100 to be held, and thickness or height of probe supporter 310, that is, that of flute 311 is determined to be longer than length of buckling portion 120 for the purpose of holding buckling portion 120 certainly within the length of flute 311.

Vertical through holes 312 for inserting fastening means 320, bolting for instance, are provided at two distant peripheries, and on the side face of the solid for flutes 311 formation, two lateral holes 313 are provided at two distant peripheries for fastening a holding plate 330 with the solid side face to secure probes 100 (8 probes shown in FIG. 20) in position by bolting 340, wherein the same device is set up at the back side, though not shown in FIG. 20.

Probe supporter 310 is conveniently worked out from generally called, machinable ceramics, for instance, [MIOCERAM 500 (trademark)] produced by HISHIDEN KASEI KK (Japanese Corporation), but not limited to the note here. Other acceptable materials are such as tractable or workable to machining work to form flutes 311 and insulative. Therefore, a suitable material may be found not only in ceramics, but also in plastics including reinforced epoxy resins, wherein cutting work to form flutes 311 is feasible by rotary cutter with thin edges or laser ray cutting for use to cut wafers, for instance.

After probes 100 are inserted or received in flutes 311 of probe supporter 310, plate 330 is associated by screws 340 to probe supporter 310 and then fastened thereby, and therethrough, respective probes 100 are arranged so as to have contact portions 110 extended the same length from underside of probe supporter 310 and also to have connecting portions 130 extended the same length from upperside of probe supporter 310.

A plurality of probe supporters 310 (4 units in FIG. 18) are mounted or fastened by fastening means 320 including bolt-nuts combination. Thereby connecting portions 130 of probes 100 are extended upward from the upperside of board 200 through the through holes 220 of board 200.

Connecting portion 130 is connected to land portion at periphery of through hole 220 by soldering. Therein connecting portion 130 extends past solder bump 230 a little length (specifically about 1.0 to 1.5 mm) after connected by the soldering.

In the structures thus assembled with use of probe 100, connecting portion 130 takes position from through hole 220 of board 200 to inside flute 311 of probe supporter 310, and buckling portion 120 takes position inside flute 311, and contact portion 110 takes position from inside flute 311 to outside thereof.

Measurement of electrical characteristics of semiconductor integrated circuit 700 is carried out by vertically operative type probe card assembly thus structured as below:

A plurality of silicon wafers with semiconductor integrated circuits 700 formed thereon are set on lifter 750 with vacuum sucking mechanism, and then lifter 750 is lifted upward to contact electrodes 710 of semiconductor integrated circuits 700 to the ends of contact portions 110 of probes 100.

After contact portion 110 has contacted electrode 710, lifter 750 is lifted to effect an overdrive. Thereby probe 100 is pressed from upper and under and in turn buckling portion 120 of probe 100 buckles with a result of effecting desired contact pressure onto electrode 710. In the meantime, buckling portion is positioned inside flute 311 and for this reason no contact between adjacent probes will occur.

Upon finishing the measurement of electrical characteristics of semiconductor integrated circuit 700, lifter 750 is lowered to prepare for next measurement.

Assuming that one probe 100 is damaged in a plurality of probes 100 incorporated in the present assembly, the damaged probe 100 will be exchanged as below:

First identify which probe supporter 310 the damaged probe 100 belongs to, and remove all solder masses which connect connecting portions 130 of probes 100 to wiring pattern 210, and then relax fastening means 320 which connects probe supporter 310 to board 200 and in turn remove probe supporter 310 from board 200. Then, relax holding plate 330 to remove damaged probe 100 from probe supporter 310.

Exchange work continues: new probe 100 is disposed in place of damaged probe 100 into flute 311 and holding plate 330 is re-fastened and in turn probe supporter 310 including new probe 100 is re-fastened with board 200 and re-soldered to connect all probes 100 to wiring pattern 210.

If damaged probe 100 is not broken in itself, removal thereof is carried out as below: two clipping tools made of electrical current conduction are prepared and these two tools are attached to contact portion 110 by one clip and to connecting portion 130 by the other clip so that damaged but non-broken probe 100 is involved in a circuit through the two clips, and then conduct a several ampere current for several seconds to heat-fuse solder mass which has connected probe 100 to wiring pattern 210. If solder is fused, pull out probe 100 of interest upward and new probe 100 is inserted from upper for replacement, and connecting portion 130 of new probe 100 is connected to wiring pattern 210 by soldering.

This method does not need steps of removing probe supporter 310 including damaged probe 100 and thereby the exchange work results in simpler.

The description so far assumes that probe 100 and flute 311 are related dimensionally like in a rod to sleeve pipe relationship, but the present assembly is not limited to such relationship.

Figure 22:
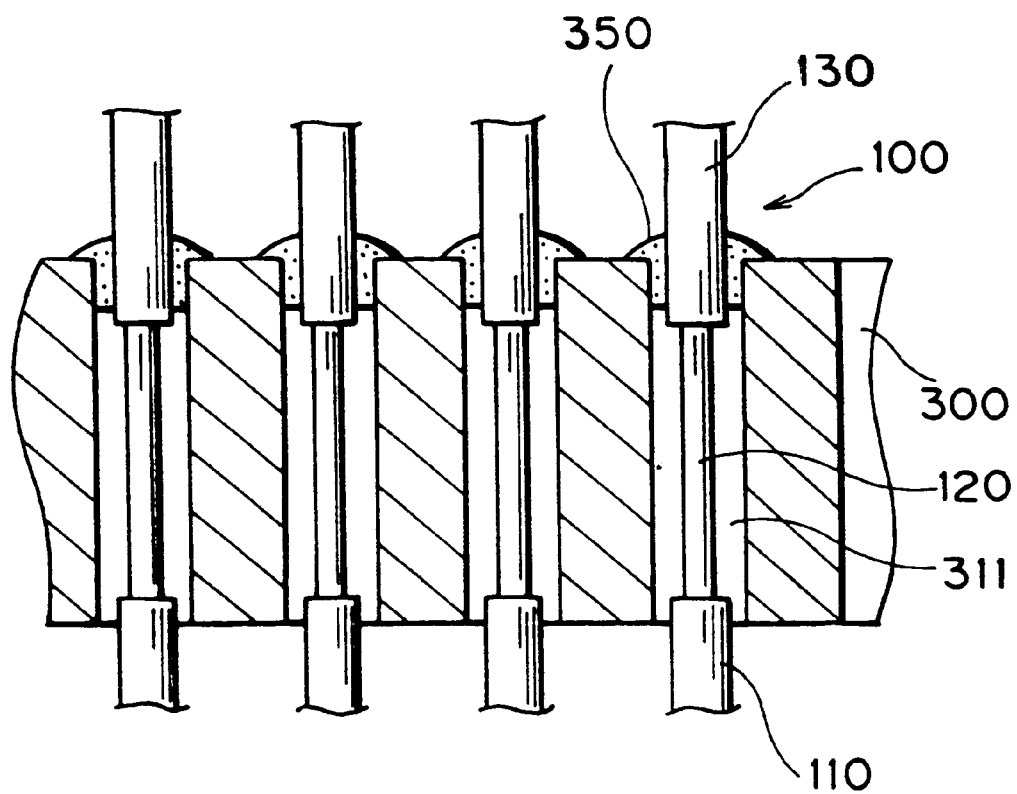
FIG. 22 shows a schematic sectional view explaining connection between a probe supporter and probes.

For instance, as shown in FIG. 22, probe 100 inserted in flute 311 may be fixed by insulative filler or putty resin 350. In this case, if such resin 350 fixes buckling portion 120, this portion become unlikely to buckle and thereby application of resin 350 is restricted to area between connecting portion 130 and flute 311, and further in this case, holding panel 330 will act to protect resin 350 from flow out of flute 311.

If flowing out of such resin 350 is not thought to occur, holding panel 330 is no longer needed. Thereby it is allowable to decrease the number of parts or steps in manufacture of the present assembly, or steps involved in the exchange work.

If such resin 350 is employed in holding probe 100, conduction of current as noted before will fuse not only solder mass, but also such resin 350.

In the description so far, probe 100 has been assumed to be linear, but not limited so, but probe 100 may be of L-letter shape, wherein connecting portion 130 of probe 100 includes vertical sub-portion 131 and lateral sub-portion 132 bending about at right angles against vertical sub-portion 131.

Probe 100 so structured has following advantages. In the work of exchanging probe 100, its heightwise position of the end of contact portion 110 is uniformized conveniently. Specifically, in the state that probe supporter 310 has been fastened, acts of inserting the end of contact portion 110 of probe 100 into through hole 220 of board 200 and placing lateral sub-portion 132 of connecting portion 130 on the upperside of board 200, will determine heightwise position of contact portion 110.

Further as shown in FIG. 4, L-letter probe 100 is structured to have connecting portion 130 including vertical sub-portion 131 made linear to buckling portion 120 and lateral sub-portion 132 bending about at right angles against vertical sub-portion 131, and this is modified so that the bending part from vertical sub-portion 131 is made to extend upward a little to form extension end 133. This extension end 133 is useful in the exchange work by the method of fusing the solder mass with electrical heating as noted before. Specifically extension end 133 makes it convenient to apply clipping tool in place.

In the description so far, one unit of flute 311 has been allocated to receive or hold one piece of probe 100, but not limited so. For instance, as shown in FIG. 23, it is feasible to place two pieces of probe 100.

This placement of a plurality of probes 100 is useful if intervals between electrodes 710 of semiconductor integrated circuit 700 are narrower than intervals between flutes 311 wherein machinability to fine parts for flute 311 is difficult. Therein it is likely that intervals of electrodes 710 are partially made narrow.

Figure 23:
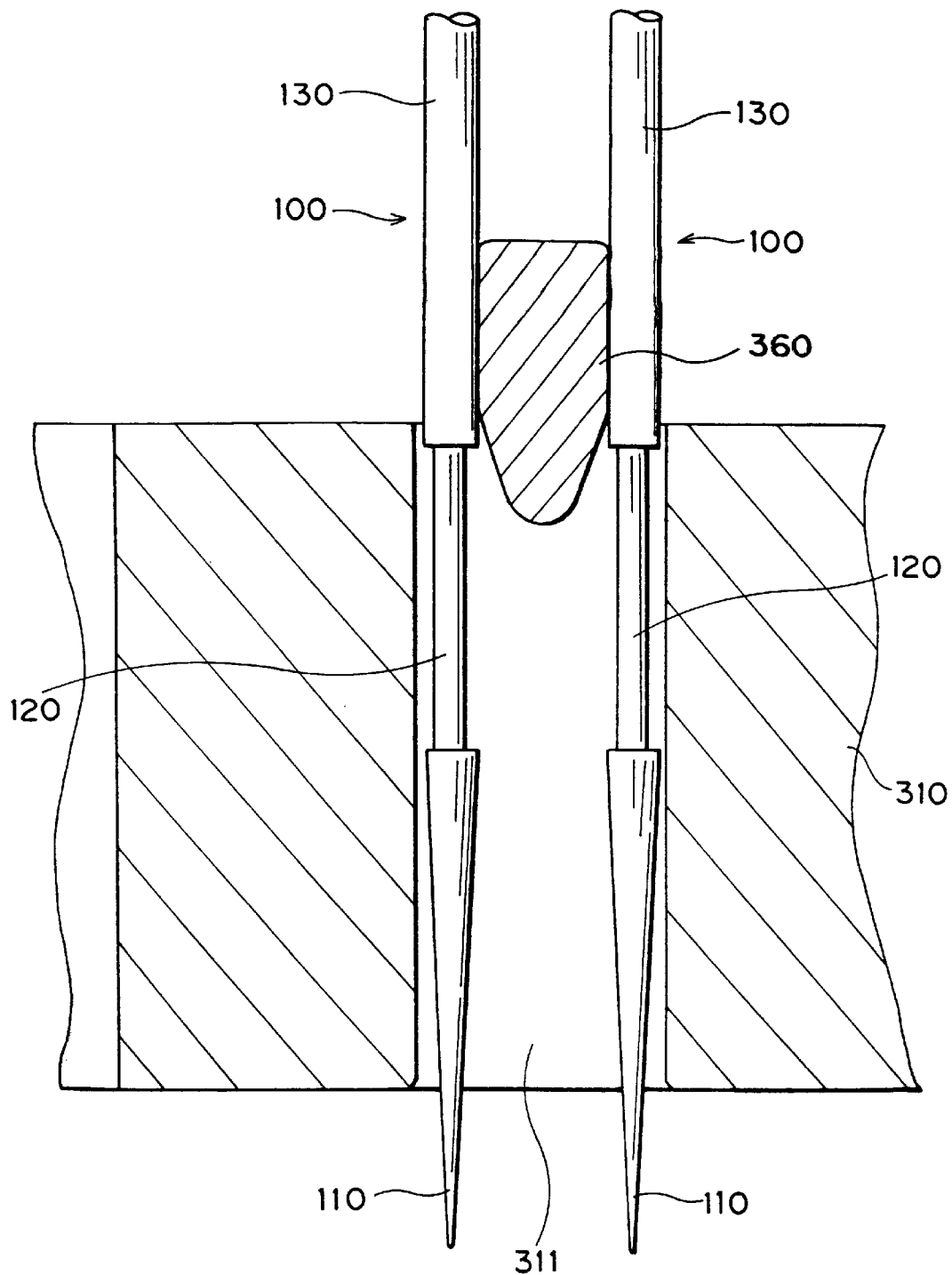
FIG. 23 shows a schematic sectional view explaining arrangement of probes in a flute.

This case makes it important to keep insulation or separation between adjacent probes 100 held in one flute 311 and to apply insulative fixer 360 in a wedge shape between probes as shown in FIG. 23.

Alternatively, this case allows the use of probes 100 coated with insulative coating which at least is applied to surfaces to be placed inside flute 311 of probe supporter 310. However, in the case of using coated probes 100 as noted, the use of fixer 360 as noted is recommended.

Advantages of the Invention

The probe of the present invention relates to a probe which features in; having a buckling portion to buckle upon a contact by the end of contact portion onto an electrode of semiconductor integrated circuit; and having a generally round section and the buckling portion made slenderized than other portions excepting the end of contact portion, wherein the contact portion and buckling portion are shaped to be linear.

Accordingly, a vertically operative type probe card assembly employing the inventive probes makes it convenient to carry out the probe exchange work as compared with conventional case. Specifically, the exchange of probes is allowed without cutting the problem probes. That is, release of the probes from a wiring pattern permits to pull out the probes conveniently from a board. Further in mounting new probes to the board, all needed is to insert the probe into the board and to connect it to a wiring pattern. Thus the probe exchange work is remarkably made convenient as compared with conventional case.

In the wwork of releasing a connecting portion of a probe from a wiring pattern to which the solder connection has been formed, this invention discloses the art of making an extending end of the probe for the connection. Now it is assumed that the probe descried has been damaged. Then, release by fusing with electrical heating is applied, that is, clipping tool is conveniently applied to the extending end and the conduction of a current of several amperes for several seconds readily fuses the solder connection. Thereby pulling out the damaged probe upward is feasible and needed thereafter is to insert a new replacement probe from above. Thus, greatly convenienced.

As for a probe which has a connecting portion including a vertical sub-portion made linear to a buckling portion and a lateral sub-portion bending at right angles, the present invention discloses the art of forming an upwardly extending end at the bending point. In the case of such probe, the release work of the probe as noted is convenienced, further in the work of mounting it, the length from upper point of vertical sub-portion to the end of contact portion is made uniform or fixed. Thereby effort in uniformizing heightwise positions of probes is made minimum.

In the point of making minimum with the effort as noted, the same is awarded as to a probe which has a connecting portion including a vertical sub-portion made linear to a buckling portion and a lateral sub-portion bending at right angles without an upwardly extending end.

Therein it is assumed that the probe as noted is designed, similar to other probes, to have the same length from the bending point between the lateral sub-portion and vertical sub-portion down to the end of contact portion, the effort of uniformizing positions of contact portions is omitted in much the same way as noted.

Further, probes are each provided with a minuscule ball at the end of contact portion, and thereby are repulsive to foreign matter adhesion. Accordingly, such trouble is unlikely as aluminum which is a constituent of an electrode will attach to the end of contact portion, and for that cause, otherwise deviated measurement results.

As for manufacture of the probe with a minuscule ball intended to contact an electrode of semiconductor integrated circuit, the process therefor includes the step of heating to melt the end of contact portion which will contact an electrode, and the step of forming the molten mass to a target minuscule ball. Thereby manufacture of the probe which will unlikely cause deviated measurement.

Therein, heating to melt the part to be contacted to an electrode is feasible by irradiation with laser ray, induction heating with high frequency coil, arc discharge for choice.

In addition, alternative method is to press-attach a preformed minuscule ball onto the end of contact portion of a probe. This method is suitable to mass scale production and to lower production cost.

Turning to the probe card assembly of vertically operative type, firstly, the present invention includes a probe card assembly of vertically operative type which features: a plurality of probes having a buckling portion to buckle, upon a contact by an end of a contact portion onto an electrode of semiconductor integrated circuit; a first board.provided with a first wiring pattern connected with a connecting portion of the probe; a second board removably fastened with the first board and provided with a second wiring pattern connected with the first wiring pattern; housing members mounted with the second board for controlling the contact portion of the probe; wherein the probe has a generally round section and its buckling portion is thinner than other portions excepting the end of the contact portion, and the contact portion and the buckling portion are formed linear, and wherein through holes are provided with the first board for inserting through the respective probes, and second board is provided with a through space for the probe extending through in state as-suspended from the first board.

In this assembly, the probe is structured for its buckling and contact portions being linear, and the first board is provided with through holes, and therefore, release of connection to wiring pattern formed on first board will permit to pull out the probe from the first board, and further its structure serves for convenience in mounting a new probe.

In addition, in the case wherein a plurality of probes are needed to replace, it is readily allowable to replace the needy probe only or to replace all probes together with the first board. Therefore, reasonable work is feasible as needed.

Secondly, the present invention includes a probe card assembly of vertically operative type including: a plurality of measurement probes including buckling portions to buckle, upon a contact by an end of contact portion onto an electrode of semiconductor integrated circuit; first board provided with wiring pattern connected to ends of connecting portions of the measurement probes; second board superjacent to and fastened removably with the first board; a plurality of connection probes including buckling portions to buckle, upon a contact by an end of contact portion onto the wiring pattern provided with the first board when inserted into holes provided with the a second board; wherein through holes provided with the second board are positioned to align to the arrangement of wiring pattern provided with the first board; wherein the measurement probes and connection probes have generally round section and their buckling portions are thinner excepting ends of contact portions, and formed linear; wherein the first board is provided with through holes for measurement probes inserting through, and the second board is provided with wiring pattern for connecting to ends of connection probes.

Much similar to the assembly as noted previously, This assembly facilitates the exchange work as noted above.

Thirdly, the present invention includes a probe card assembly of vertically operative type including: a plurality of probes including contact portion, and buckling portion to buckle, upon a contact by an end of the contact portion onto an electrode of semiconductor integrated circuit; a board provided at least on upperside with wiring pattern to which connecting portion of the probe is connected; supporting members mounted underside of the board for supporting the probes; wherein the probe is generally round and the buckling portion thereof is slender excepting the end of contact portion, and contact and buckling portions are shaped linearly; and wherein the board is provided with through holes for probes extending through; and wherein the supporting members include; a plurality of probe supporters made from insulative material and provided at periphery with a plurality of flutes for holding probes whose buckling portions take position inside the flutes, and fastening means for fastening removably the probe supporters underside of the board.

In this assembly, the buckling portion of a probe is made slender, and the contact and buckling portions are formed linear, so that exchange of probes is permitted without cutting the problem probe unlike conventional case. Specifically, release of connection between the probe and wiring pattern permits to pull out readily the probe from the board, and in mounting a new probe, needed is to insert a new probe into the board and connecting to the wiring pattern. This is remarkably convenient as compared with conventional case.

Probe length is made shorter by slenderizing the buckling portion with linearity to the contact portion kept. Specifically, conventional one has buckling portion with the same diameter as other portions wherein the buckling portion was formed by bending the wire to be lateral U-letter shape, and accordingly the total length used for preparing one unit probe is longer in the conventional case. On the other hand, target today is a shorter probe, in view of attenuation of signals or cross talk problem in measuring electrical characteristics of recent semiconductor integrated circuit wherein high speed signals are prevail. Therein the buckling portion is certainly kept which will buckle upon a contact by contact portion onto an electrode of semiconductor circuit, so that predetermined desired contact pressure is reassured.

Further, the supporting members includes the holding panel mounted removably which will laterally close the flute. Therefore, even if some lateral force from outside will act thereon, leaving out of the probe from the flute is avoided, and thereby electrical shortcircuit will also be prevented.

In the case of fixing the probe received in the flute with use of resin, instead of the holding panel, wherein portion other than buckling and contact portions is made use of the fixation. Therefore, the holding panel is no longer needed. This simplifies the structure of the present assembly.

In the case of holding a plurality of probes in one flute, more highly densified integrated circuit will be accepted for measurement.

In the case of holding a plurality of probes in one flute as noted above, portion of the probe which takes position inside the flute is coated with insulative coating. Thereby more certain insulation is reassured so that no shortcircuit problem will occur and it is made feasible to measure more densified circuit.

Further, in the same case as above wherein a plurality of probes are held in one flute and insulative fixer is applied to fix the probes, the plurality of the probes are arranged to take certain respective positions, and therefore correct measurement is feasible to more number of probes at once.

What is claimed is:

1. A vertically operative probe card assembly comprising:
a plurality of probes, each of the probes having a contact portion, a buckling portion and a support portion, wherein the buckling portion buckles whenever the contact portion contacts an electrode of a semiconductor integrated circuit;
a board which has a wiring pattern thereon, each said plurality of probes being connected to said wiring pattern;
means for stabilizing alignment of the contact portion of each of said plurality of probes;
wherein each of said plurality of probes has a substantially round cross-section, is shaped so that the buckling portion is disposed between said support portion and said contact portion and is thinner than said support portion and said contact portion thereof, except for the end of the contact portion, and so that the contact portion, the support portion and the buckling portion are formed linearly.

2. The vertically operative probe card assembly according to claim 16, wherein each of said probes has a connecting portion (130) connected to a respective buckling portion (120), and wherein said board is a first board (400) and said wiring pattern provided on said board is a first wiring pattern (420 connected with the connecting portions (130) of each of said probes (100);

the probe car assembly further comprising:

a second board (500) removably fastened with said first board (400) and provided with a second wiring pattern (520), which is connected with said first wiring pattern (420); and a housing member (600) mounted with said second board (500) for controlling said contact portion (110) of said probe (100);

wherein through holes (410) are provided in said first board (400) through which respective probes (100) are inserted, and wherein said second board (500) is provided with a through space (510) through which said probes (100) extend in a suspended state from said first board (400).

3. The vertically operative probe card assembly according to claim 1, wherein said probes are measurement probes (100A), each including a connecting portion (130A) connected to a respective buckling portion (120A);

wherein said board is a first board (900A) and said wiring pattern provided on said board is a first wiring pattern (910A) connected to ends of said connecting portions (130A) of said measurement probes (100A);

the probe card assembly further comprising:

a second board (900B) superjacent to and fastened removably with the first board (900A);

a plurality of connection probes (100B), each of said connection probes including a buckling portion (120B), wherein the buckling portion (120B) of each connection probe (100B) buckles whenever a respective contact portion (110B) contacts said wiring pattern (910A) provided with the first board (900A), each of said connection probes (100B) being inserted into through holes (901B) provided in said second board (900B);

wherein said through holes (901B) provided in said second board (900B) are positioned to align to the arrangement of said first wiring pattern (910A) provided with said first board (900A);

wherein each of said connection probes (100B) has a substantially round cross section and and is shaped so that the buckling portion (120B) of each of said connecting probes is thinner than other portions thereof, except for the end of the respective contact portion (110B), and so that the contact portion (110B) and the buckling portion (120B) thereof are formed linearly;

wherein said first board (900A) is provided with through holes (901A) through which measurement probes (100A) are inserted and wherein said second board (900B) is provided with a second wiring pattern (911B) to which ends of said connection probes (100B) are connected.

4. The vertically operative probe card assembly according to claim 1, wherein each of said probes has a connecting portion (130) connected to said buckling portion (120): and wherein said wiring pattern (210) is provided at least on an upperside and being connected to said connecting portion (130) of said probe (100);

said probe card assembly further comprising:

supporting members (300) mounted to an underside of said board (200) so as to support said probes (100);

wherein the supporting members (3001 include:

a plurality of probe supporters (310) made from insulative materials and provided with a plurality of flutes (311) for holding, probes (100) such that the buckling portions (120) of the probes (100) are positioned inside the flutes (311), and fastening means (320) for removably fastening said probe supporters (320) to said underside of said board (200).

5. A probe card assembly of vertically operative type as defined in claim 4, wherein the probe supporter 310 is removably provided with a holding plate 330 for closing laterally a probe 100 in the flute 311.

6. A probe card assembly of vertically operative type as defined in claim 4 or 5, wherein the probe 100 held in the flute 311 is fixed at its connecting portion other than the buckling and the contact portion 120, 110 with a resin.

7. A probe card assembly of vertically operative type as defined in claim 4 or 5, wherein a plurality of probes (100) are held in one flute (311).

8. A probe card assembly of vertically operative type as defined in claim 7, wherein the plurality of probes 100 held in one flute 311 are probes 100 whose part held inside the flute 311 is coated with insulative coating.

9. A probe card assembly of vertically operative type as defined in claim 17, wherein the plurality of probes (100) held in one flute (311) are fixed with insulative fixer (360).

10. A probe card assembly of vertically operative type as defined in claim 6 wherein a plurality of probes (100) are held in one flute (311).

11. A probe card assembly of vertically operative type as defined in claim 10, wherein the plurality of probes (100) held in one flute (311) are probes (100) whose part held inside the flute (311) is coated with an insulative coating.

12. A probe card assembly of vertically operative type as defined in claim 8, wherein the plurality of probes (100) held in one flute (311) are fixed with insulative fixer (360).

13. A probe card assembly of vertically operative type as defined in claim 10, wherein the plurality of probes (100) held in one flute (311) are fixed with insulative fixer (360).

14. A probe card assembly of vertically operative type as defined in claim 11, wherein the plurality of probes (100) held in one flute (311) are fixed with insulative fixer (360).

* * * * *